United States Patent
Ahn

(10) Patent No.: US 8,946,783 B2
(45) Date of Patent: Feb. 3, 2015

(54) IMAGE SENSORS HAVING REDUCED DARK LEVEL DIFFERENCES

(71) Applicant: Samsung Electronics Co., Ltd., Suwon-si (KR)

(72) Inventor: Jung-Chak Ahn, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 8 days.

(21) Appl. No.: 13/766,803

(22) Filed: Feb. 14, 2013

(65) Prior Publication Data

US 2013/0334577 A1 Dec. 19, 2013

(30) Foreign Application Priority Data

Jun. 18, 2012 (KR) ........................ 10-2012-0065164

(51) Int. Cl.
*H01L 27/148* (2006.01)
*H01L 27/146* (2006.01)

(52) U.S. Cl.
CPC .... *H01L 27/14818* (2013.01); *H01L 27/14603* (2013.01); *H01L 27/14609* (2013.01); *H01L 27/14623* (2013.01); *H01L 27/1464* (2013.01)
USPC .......................................... 257/222; 257/223

(58) Field of Classification Search
CPC ..................... H01L 27/14818; H01L 27/1464; H01L 27/14893; H01L 27/14862; H01L 27/14612
USPC .................. 257/222, 223, 230, 445
See application file for complete search history.

(56) References Cited

U.S. PATENT DOCUMENTS

| | | | |
|---|---|---|---|
| 6,838,298 B2 | 1/2005 | Lee | |
| 7,507,614 B2 | 3/2009 | Rim et al. | |
| 7,582,502 B1 | 9/2009 | Hwang et al. | |
| 7,701,493 B2 | 4/2010 | Mauritzson | |
| 7,714,403 B2 | 5/2010 | Lee et al. | |
| 7,939,359 B2 | 5/2011 | Ohgishi | |
| 2006/0175535 A1* | 8/2006 | Park et al. | 250/208.1 |
| 2009/0309144 A1 | 12/2009 | Park et al. | |
| 2010/0193670 A1 | 8/2010 | Kanbe | |
| 2011/0031376 A1 | 2/2011 | Oshiyama et al. | |
| 2011/0260221 A1 | 10/2011 | Mao et al. | |
| 2012/0013777 A1* | 1/2012 | Mao et al. | 348/280 |
| 2012/0249845 A1* | 10/2012 | Zheng et al. | 348/243 |

FOREIGN PATENT DOCUMENTS

KR 1020030058291 A 7/2003
KR 1020100025873 A 3/2010

* cited by examiner

*Primary Examiner* — Caridad Everhart
(74) *Attorney, Agent, or Firm* — Myers Bigel Sibley & Sajovec, P.A.

(57) ABSTRACT

An image sensor including a semiconductor layer including a plurality of unit pixels each including a photoelectric conversion device and read devices; and an insulating layer including a light-shielding pattern defining a light-receiving region and a light-shielding region of the semiconductor layer, the insulating layer covering one surface of the semiconductor layer. The semiconductor layer further includes a potential drain region formed adjacent to an interface between the semiconductor layer and an insulating layer in the light-shielding region, wherein electrons generated due to defects occurring at the interface are accumulated in the potential drain region. At least one of the unit pixels in the light-shielding region provides a drain path for draining the electrons accumulated in the potential drain region.

23 Claims, 16 Drawing Sheets

IMAGE SENSORS HAVING REDUCED DARK LEVEL DIFFERENCES

CROSS-REFERENCE TO RELATED APPLICATION

This application claims the benefit under 35 U.S.C. §119 of Korean Patent Application No. 10-2012-0065164, filed on Jun. 18, 2012 in the Korean Intellectual Property Office, the disclosure of which is incorporated herein in its entirety by reference.

BACKGROUND

The inventive concept relates to image sensors, and more particularly, to image sensors in which the difference between dark levels of light-receiving regions and of light-shielding regions is reduced.

Image sensors are devices or electronic components that transform an optical image into an electrical image signal, e.g., a charge-coupled device (CCD) and a complementary metal oxide semiconductor (CMOS) image sensor. CMOS image sensors include front side illumination (FSI) CMOS image sensors in which light is incident on a front surface of a substrate on which unit pixels are disposed, and back side illumination (BSI) CMOS image sensors in which light is incident on a back surface of a substrate.

To secure high image quality using a CMOS image sensor and to reduce degradation in image quality, a hydrogen alloy process or an ultra-violet (UV) process may be employed during the manufacture of the CMOS image sensor to fix dangling bonds and/or interface defects in the substrate. However, in the case of the BSI CMOS image sensor, the efficiency of the hydrogen alloy process or the UV process may be lowered in a light-shielding region due to a light-shielding pattern. This can increase the difference between dark levels of a light-receiving region and the light-shielding region.

SUMMARY

The inventive concept provides an image sensor in which the difference between dark levels of a light-receiving region and a light-shielding region may be reduced.

According to an aspect of the inventive concept, there is provided an image sensor including: a semiconductor layer including a plurality of unit pixels that each include a photoelectric conversion device and read devices; an insulating layer including a light-shielding pattern defining a light-receiving region and a light-shielding region of the semiconductor layer, the insulating layer on a first surface of the semiconductor layer; a potential drain region formed in the semiconductor layer adjacent to an interface between the semiconductor layer and the insulating layer in the light-shielding region, wherein electrons generated due to defects occurring at the interface are accumulated in the potential drain region. In these image sensors, at least a first of the unit pixels in the light-shielding region provides a drain path for draining the electrons accumulated in the potential drain region.

The potential drain region may be formed in the entire light-shielding region.

The potential drain region may be spaced apart from the photoelectric conversion device of each of the plurality of unit pixels The drain path may extend from the potential drain region to the photoelectric conversion device of the first of the unit pixels.

The first of the unit pixels in the light-shielding region may include a contact region in the photoelectric conversion device, to which a power supply voltage is applied, and the drain path may extend from the potential drain region to the contact region.

The read devices may include a reset device, and the drain path may extend from the potential drain region to a first of the reset devices.

The read devices may include a charge transfer device and a selection device, wherein the charge transfer device and the reset device are turned on when the selection device is not turned on.

The semiconductor layer may further include a barrier region formed in the semiconductor layer adjacent to the potential drain region in the light-shielding region, wherein the barrier region is configured to extinguish electrons in the potential drain region.

The barrier region may be formed in a portion of the light-shielding region including unit pixels, except for the at least the first unit pixel providing the drain path.

The semiconductor layer may further include a plurality of electron adjustment path regions, each of which may be configured to provide a respective path for moving electrons to the photoelectric conversion device of a respective one of the plurality of unit pixels.

The electron adjustment path regions in the light-receiving region may extend in a depthwise direction of the semiconductor layer and be spaced apart from a lower surface of the semiconductor layer and adjacent to the photoelectric conversion devices of units pixels in the light-receiving region, respectively.

The electron adjustment path regions in the light-shielding region may extend in a depthwise direction of the semiconductor layer, between the potential drain region and the photoelectric conversion devices of units pixels in the light-shielding region.

According to another aspect of the inventive concept, there is provided a backside illumination type image sensor.

An image sensor may include: a semiconductor layer including a plurality of unit pixels each including a photoelectric conversion device and read devices; and an insulating layer including a light-shielding pattern defining a light-receiving region and the light-shielding region of the semiconductor layer, the insulating layer covering a lower surface of the semiconductor layer, wherein the semiconductor layer further comprises a barrier region formed adjacent to an interface between the semiconductor layer and the insulating layer in the light-shielding region to extinguish electrons generated due to defects occurring near the interface.

An image sensor according to further embodiments of the inventive concept may include an insulating layer; a light-shielding pattern; and a semiconductor layer on the insulating layer and the light-shielding pattern. The semiconductor layer may have a light-receiving region that includes a first photoelectric conversion device and a light-shielding region that includes a second photoelectric conversion device. The light-shielding region of the semiconductor layer includes at least a first electron removal region, the first electron removal region being located between the second photoelectric conversion device and the insulating layer.

In some embodiments, the first electron removal region may be a potential drain region in the light-shielding region of the semiconductor layer adjacent an interface between the semiconductor layer and the insulating layer and a drain path that extends from the potential drain region to at least the second photoelectric conversion device. In other embodiments, the first electron removal region comprises a potential drain region in the light-shielding region of the semiconductor layer adjacent an interface between the semiconductor layer and the insulating layer and an electron adjustment path region in the semiconductor layer that provides a path for moving electrons from the potential drain region to the second photoelectric conversion device. In still other embodiments, the first electron removal region comprises a barrier region in the light-shielding region of the semiconductor layer that has a higher impurity doping concentration than a portion of the semiconductor layer that is between the barrier region and the second photoelectric conversion device. The first electron removal region may not extend into the light-receiving region of the semiconductor layer.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
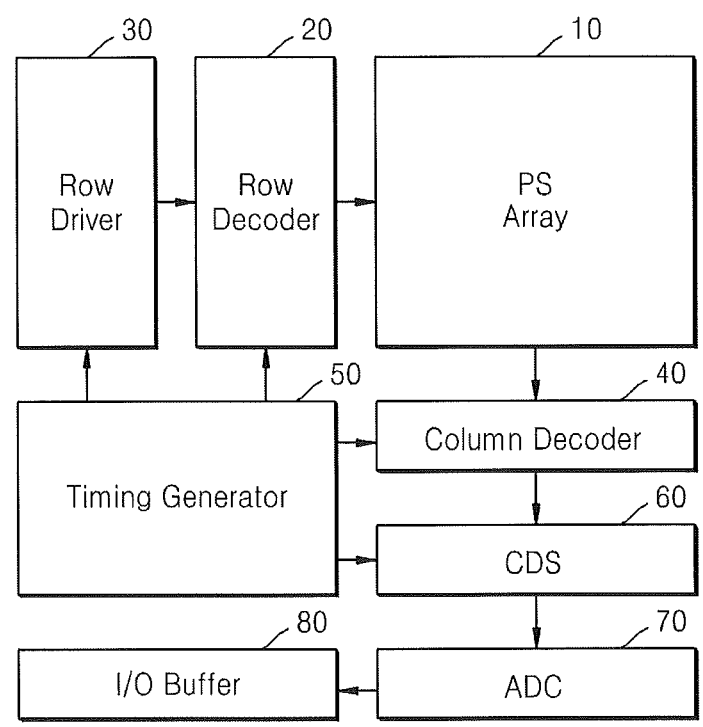
FIG. 1 is a block diagram of an image sensor according to an embodiment of the inventive concept.

Hereinafter, the inventive concept will be described more fully with reference to the accompanying drawings, in which example embodiments of the invention are shown. These embodiments are provided so that this disclosure will be thorough and complete, and will fully convey the scope of the inventive concept to those of ordinary skill in the art. The inventive concept may, however, be embodied in many different forms and should not be construed as limited to the example embodiments set forth herein. Instead, the present application covers all modifications, equivalents, and alternatives falling within the scope of the inventive concept. Like reference numerals denote like elements throughout the drawings. In the drawings, the lengths and sizes of layers and regions may be exaggerated for clarity.

The terminology used herein is for the purpose of describing particular embodiments only and is not intended to be limiting of the invention. As used herein, the singular forms 'a', 'an', and "the" are intended to include the plural forms as well, unless the context clearly indicates otherwise. It will be further understood that the terms 'comprise', 'include' and/or 'has', when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "and/or" includes any and all combinations of one or more of the associated listed items. Expressions such as "at least one of," when preceding a list of elements, modify the entire list of elements and do not modify the individual elements of the list.

Figure 2:
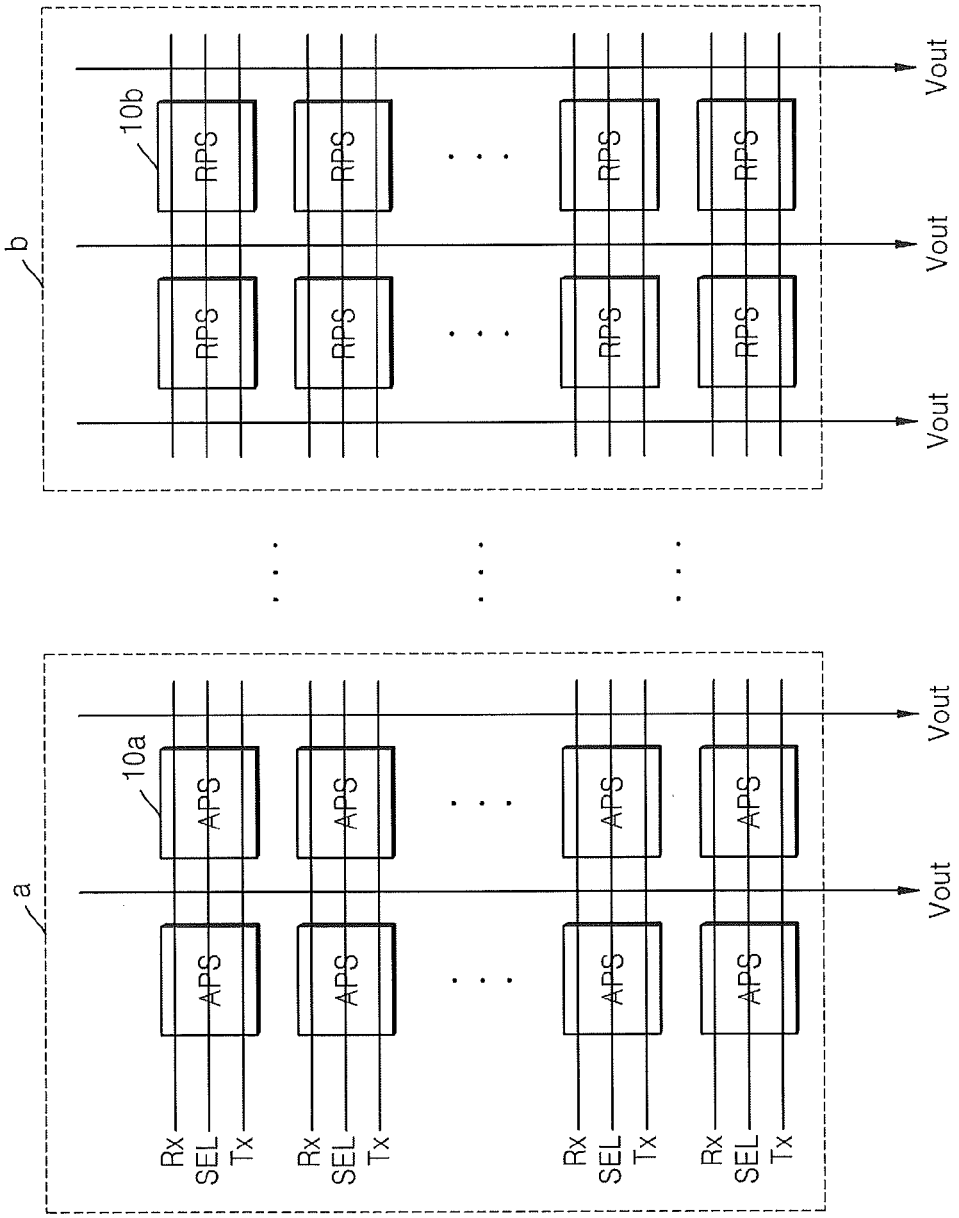
FIG. 2 is a schematic circuit diagram of a pixel sensor (PS) array that is included in the image sensor of FIG. 1, according to an embodiment of the inventive concept.

FIG. 1 is a block diagram of an image sensor according to an embodiment of the inventive concept. FIG. 2 is a schematic circuit diagram of a pixel sensor (PS) array 10 included in the image sensor of FIG. 1, according to an embodiment of the inventive concept.

Referring to FIG. 1, the image sensor may include the PS array 10, a row decoder 20, a row driver 30, a column decoder 40, a timing generator 50, a correlated double sampler (CDS) 60, an analog-to-digital converter (ADC) 70, and an input/output (I/O) buffer 80.

As illustrated in FIG. 2, the PS array 10 may include a light-receiving region a on which light is incident, a light-shielding region b on which light is not incident. A plurality of unit pixels are arranged two-dimensionally in each of the light-receiving region a and the light-shielding region b. Unit pixels in the light-receiving region a, i.e., active pixel sensors (APS) 10a, may transform light incident thereon into electrical signals. Unit pixels in the light-shielding region b, i.e., reference pixel sensors (RPS) 10b, may also generate and output electrical signals. The unit pixels of the light-receiving region a and the light-shielding region b may be driven according to a plurality of driving signals, e.g., a row selection signal SEL, a reset signal Rx, and a charge transfer signal Tx, which are received from the row driver 30 via the row decoder 20. Also, an electrical signal generated by the PS array 10 may be decoded by the column decoder 40 and may then be provided to the CDS 60.

The row driver 30 may supply the plurality of driving signals to the row decoder 20 to drive the unit pixels. The row decoder 20 may supply the plurality of driving signals to the PS array 10, based on a result of decoding the electrical signal. When the unit pixels are arranged in a matrix, the plurality of driving signals may be supplied to the unit pixels in units of rows.

The timing generator 50 may provide a timing signal and a control signal to the row driver 30, the row decoder 20, the column decoder 40, and the CDS 60.

The CDS 60 may receive an electrical signal generated by the PS array 10, and hold and sample the electrical signal. The CDS 60 may perform dual sampling on a noise level and a signal level of the electrical signal, and output an analog signal corresponding to the difference between the noise level and the signal level.

The ADC 70 may convert the analog signal received from the CDS 60 into a digital signal, and output the digital signal.

The I/O buffer 80 may latch digital signals, and sequentially output the latched digital signals to an image signal processor (not shown), based on the result of decoding the electrical signal by the column decoder 40.

Figure 3:
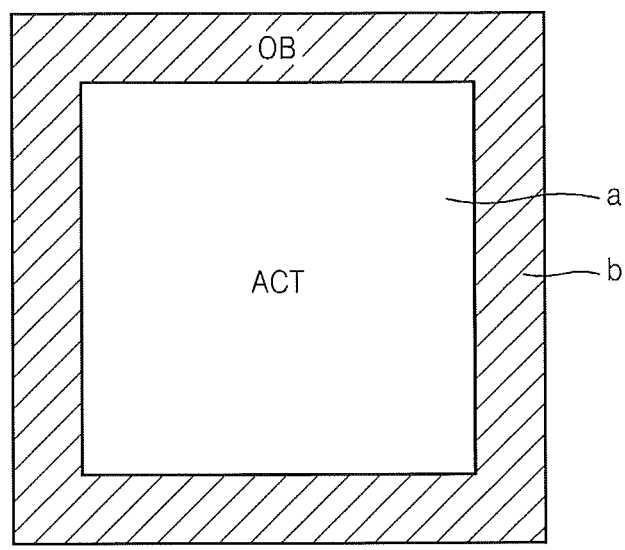
FIGS. 3 and 4 are plan views illustrating a light-receiving region and a light-shielding region of the APS array included in the image sensor of FIG. 1, according to embodiments of the inventive concept.
Figure 4:
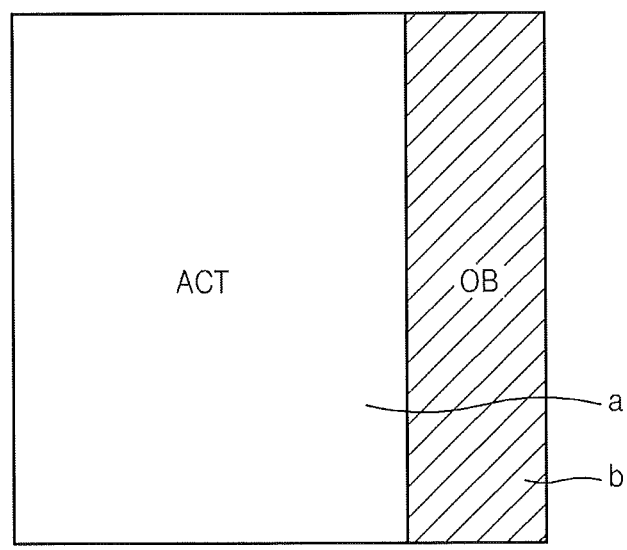

FIGS. 3 and 4 are plan views of the light-receiving region a and the light-shielding region b of the PS array 10 included in the image sensor of FIG. 1, according to embodiments of the inventive concept. The PS array 10 includes the plurality of unit pixels arranged in a matrix, and outputs electrical signals generated by the plurality of unit pixels, as described above with reference to FIG. 2. Although not shown in FIGS. 3 and 4, the image sensor may include a pad region that includes a plurality of conductive pads of the PS array 10. The pad region may be formed on a circumference of the PS array 10 so that the PS array 10 may be easily connected to external devices. In other words, the pad region may be formed in an edge portion of the image sensor. The conductive pads may be used to supply/receive driving signals, photoelectric signals, and the like to/from the PS array 10.

Referring to FIGS. 3 and 4, the PS array 10 of the image sensor may include the light-receiving region a that receives light, and the light-shielding region b that does not receive light. The light-receiving region a and the light-shielding region b may be defined by a light-shielding pattern (not shown) that is included in the image sensor. The light-shielding pattern differentiates a region of the PS array 10 on which light is incident and a region of the PS array 10 on which light is not incident from each other.

According to an embodiment of the inventive concept, when in the image sensor, the light-shielding pattern is disposed to correspond to the circumference of the PS array 10, the light-shielding region b may be defined as the circumference of the light-receiving region a, as illustrated in FIG. 3, but the inventive concept is not limited thereto. When in the image sensor, the light-shielding pattern is disposed to correspond to a side portion of the PS array 10, the light-shielding region b may be disposed at a side of the light-receiving region a, as illustrated in FIG. 4.

When light is incident on the image sensor, electrical signals may be generated from the light incident on the unit pixels, i.e., the APSs 10a, of the light-receiving region a and then be output from the light-receiving region a. Not only the electrical signals generated from the incident light but also electrical signals, i.e., noise signals, which are generated from electrons generated due to various defects may be output from the light-receiving region a. In other words, the electrical signals output from the light-receiving region a may include not only photoelectric signals but also noise signals.

Since light is not incident on the unit pixels, i.e., the RPSs 10b, in the light-shielding region b, due to the light-shielding pattern, only electrical signals (noise signals) generated from electrons occurring due to various defects may be output from the unit pixels in the light-shielding region b. When the electrical signals generated in the light-shielding region b are used as reference signals, the image sensor may output photoelectric signals from which noise signals are removed, from the electrical signals output from the light-receiving region a. The reference signals may each have a value corresponding to an average of values of the electrical signals output from the unit pixels of the light-shielding region b.

It may be difficult to obtain a high-quality image when levels of noise signals that are output from the light-receiving region a and the light-shielding region b and that are not related to incident light are different from each other, i.e., a dark level difference occurs. Thus, in order to reduce the difference between dark levels of the light-receiving region a and the light-shielding region b by fixing defects that cause the dark level difference to occur, a hydrogen alloy process is performed to supply hydrogen gas to the image sensor and a thermal treatment is performed on the image sensor during the manufacture of the image sensor. However, in the light-shielding region b, movement of hydrogen ions is limited due to the light-shielding pattern that is formed of a metal material and various defects may thus not be appropriately fixed even if the hydrogen alloy process is performed. In particular, electrons generated due to defects occurring near an interface between an insulating layer that includes the light-shielding pattern and a semiconductor layer that includes the unit pixels may not be fixed, thereby increasing the difference between the dark levels of the light-receiving region a and the light-shielding region b.

Figure 5:
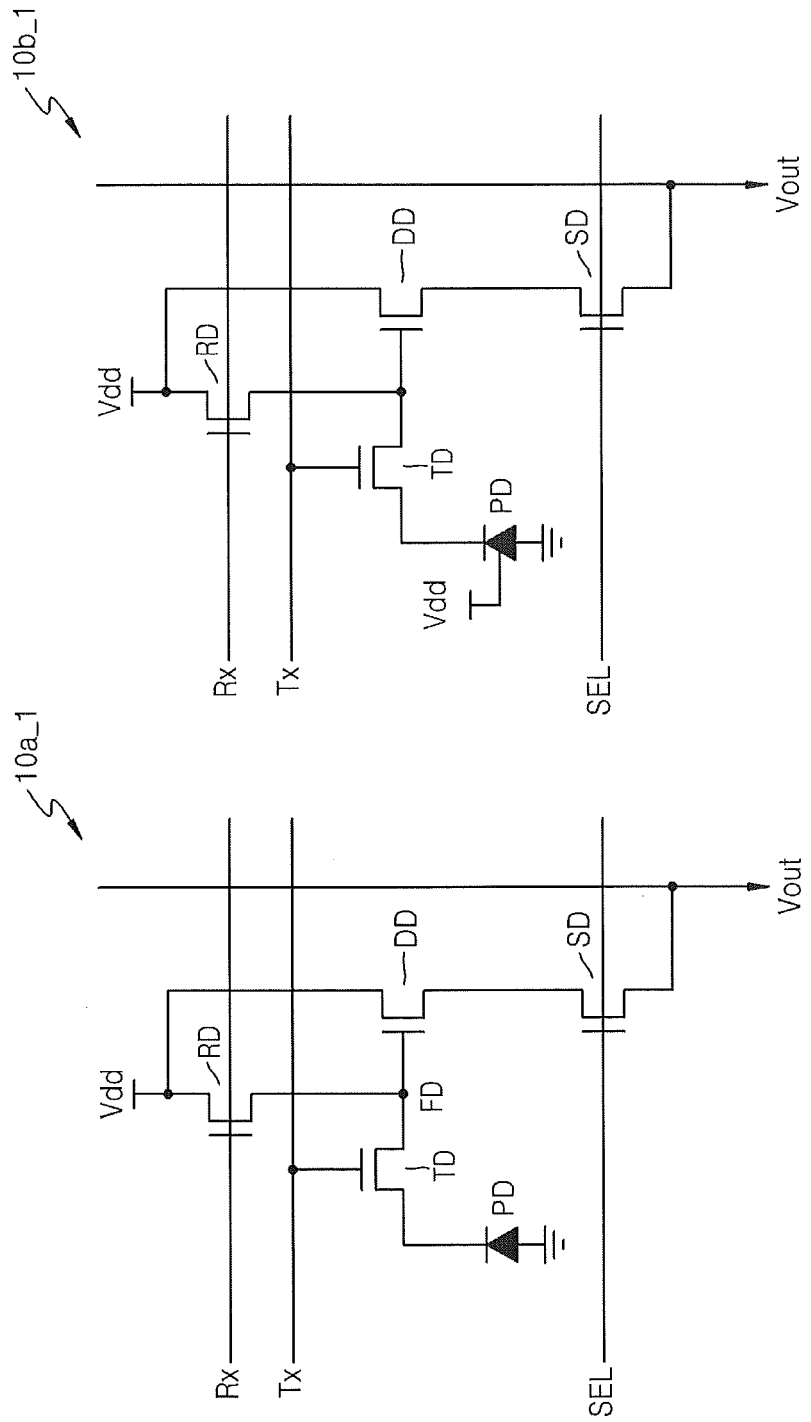
FIG. 5 is an equivalent circuit diagram of unit pixels included in an image sensor, according to an embodiment of the inventive concept.

FIG. 5 is an equivalent circuit diagram of unit pixels 10a_1 and 10b_1 that are included in an image sensor, according to an embodiment of the inventive concept. Referring to FIG. 5, the unit pixel 10a_1 is an example of the unit pixels of the light-receiving region a, and the unit pixel 10b_1 is an example of the unit pixels of the light-shielding region b (see FIG. 2). Each of the unit pixels 10a_1 and 10b_1 may include a photoelectric conversion device PD that transforms light incident thereon into an electric signal, and read devices that read the electric signal generated by the photoelectric conversion device PD. Examples of the read devices may include a charge transfer device TD, a reset device RD, a drive device DD, a selection device SD, and the like. Also, driving signal lines Tx and Rx and a row selection line SEL of the charge transfer device TD, the reset device RD, and the selection device SD, respectively, may be commonly connected to unit pixels in the same row.

More specifically, the photoelectric conversion device PD may generate and accumulate electric charges corresponding to the incident light. The photoelectric conversion device PD may be, for example, a photodiode, a photo transistor, a photo gate, a pinned photodiode (PPD), or a combination thereof. The photoelectric conversion device PD may be connected to the charge transfer device TD that delivers the accumulated electric charges to a floating diffusion region FD.

The floating diffusion region FD may receive the accumulated electric charges from the photoelectric conversion device PD. Since the floating diffusion region FD has a parasitic capacitance, electric charges may be accumulatively stored therein. Also, the floating diffusion region FD may be electrically connected to the drive device DD to control the drive device DD.

The charge transfer device TD may transmit the electric charges accumulated in the photoelectric conversion device PD to the floating diffusion region FD. In general, the charge transfer device TD includes one transistor, and may be controlled according to the charge transfer signal Tx.

The reset device RD periodically resets the floating diffusion region FD, and may be controlled according to the reset signal Rx. A source and drain of the reset device RD may be connected to the floating diffusion region FD and a power supply voltage Vdd source, respectively. Thus, when the reset device RD is turned on by the reset signal Rx, a power supply voltage Vdd may be applied to the floating diffusion region FD from the power supply voltage Vdd source connected to the drain of the reset device RD.

A combination of the drive device DD and a constant current source (not shown) may act as a source follower buffer amplifier to amplify a variation in an electric potential of the floating diffusion region FD that receives the electric charges accumulated in the photoelectric conversion device PD and output a result of the amplifying via an output terminal Vout.

The selection device SD may select unit pixels to be read in units of rows. The selection device SD may be driven according to the row selection signal SEL. When the selection device SD is turned on, the power supply voltage Vdd may be applied to a drain of the drive device DD from the power supply voltage Vdd source connected to the drain of the selection device SD.

Referring to FIG. 5, the structure of the unit pixel 10b_1 of the light-shielding region b is substantially the same as that of the unit pixel 10a_1 of the light-receiving region a, except for the structure of the photoelectric conversion device PD. In the unit pixel 10b_1 of the light-shielding region b, the power supply voltage Vdd may be applied to the photoelectric conversion device PD. In other words, in the unit pixel 10b_1 of the light-shielding region b, the photoelectric conversion device PD may have an electric potential corresponding to the power supply voltage Vdd.

Thus, in the unit pixel 10a_1 of the light-receiving region a, the electric charges accumulated in the photoelectric conversion device PD may be drained to the floating diffusion region FD only when the charge transfer device TD and the reset device RD are turned on and the power supply voltage Vdd is thus applied to the floating diffusion region FD. On the other hand, in the unit pixel 10b_1 of the light-shielding region b, it is possible to obtain a path for draining electric charges via the photoelectric conversion device PD to which the power supply voltage Vdd is applied. Thus, the unit pixel 10b_1 of the light-shielding region b may provide a path via which electric charges accumulated in a potential drain region (not shown) which will be described below may be drained, as will be described in more detail with reference to FIGS. 6 and 7.

Although FIG. 5 illustrates a case where each of the unit pixels 10a_1 and 10b_1 has a structure including four transistors, the inventive concept is not limited thereto. Each of the unit pixels 10a_1 and 10b_1 may have a structure including, for example, three transistors or a structure including five transistors, and a photo gate structure similar to the structure including four transistors.

Figure 6:
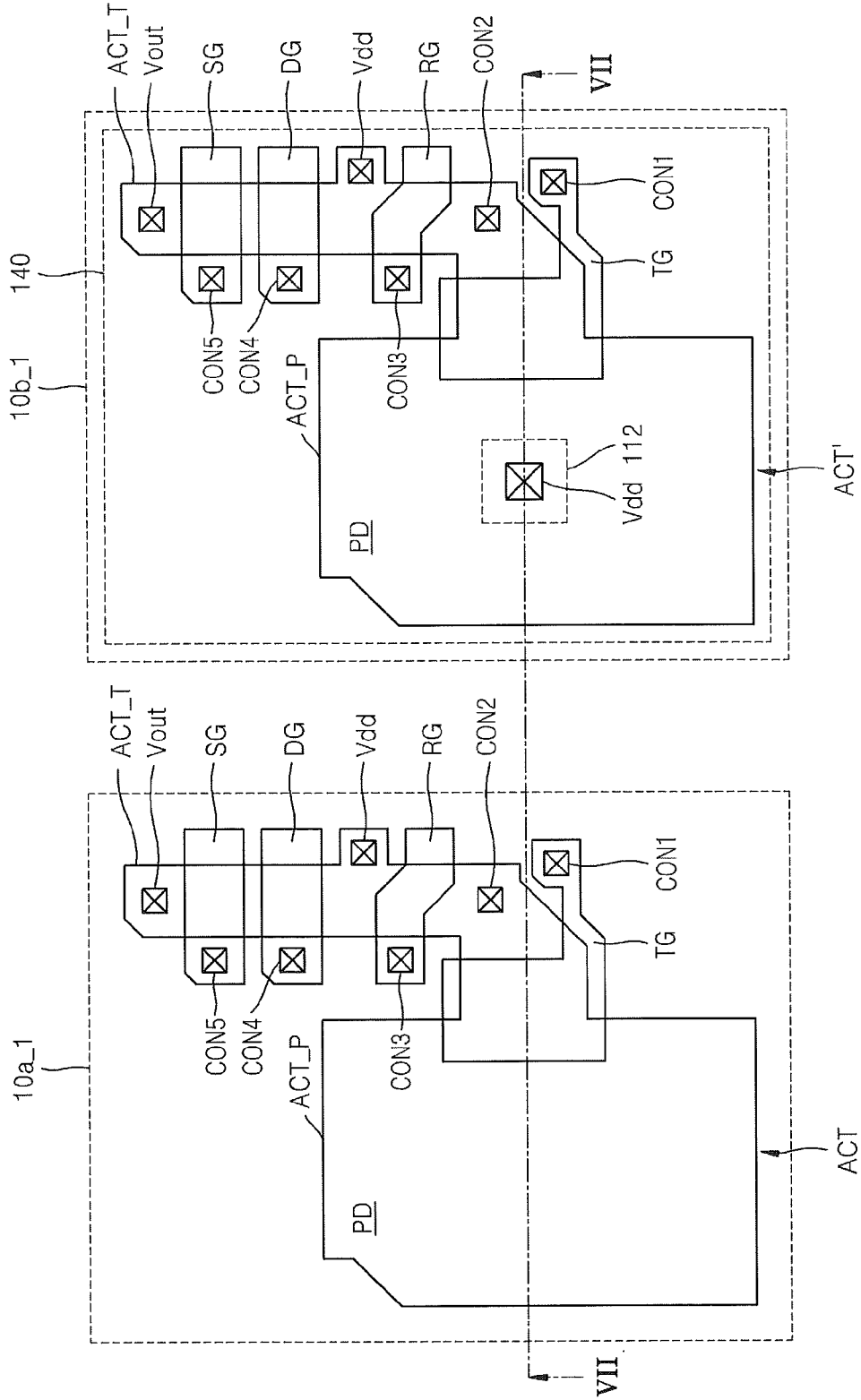
FIG. 6 is a schematic layout diagram of unit pixels included in an image sensor, according to an embodiment of the inventive concept.

FIG. 6 is a schematic layout diagram of unit pixels 10a_1 and 10b_1 included in an image sensor, according to an embodiment of the inventive concept. FIG. 6 illustrates two adjacent unit pixels 10a_1 and 10b_1 formed at an interface between a light-receiving region a and a light-shielding region b on a semiconductor layer, on which unit pixels are formed. The two adjacent unit pixels 10a_1 and 10b_1 correspond to the unit pixels 10a_1 and 10b_1 of FIG. 5, respectively.

Referring to FIG. 6, the unit pixels 10a_1 and 10b_1 may respectively include active areas ACT and ACT' formed in a predetermined shape on the semiconductor layer. Each of the active areas ACT and ACT' may be divided into a photoelectric conversion device region ACT_P in which a photoelectric conversion device PD is formed, and a read device region ACT_T in which read devices are formed. In each of the active areas ACT and ACT', the photoelectric conversion device region ACT_P, which is a light-receiving region, may be formed in a predetermined shape, e.g., in a rectangular shape on a plane, to occupy a predetermined region of the semiconductor layer including the unit pixels. The read device region ACT_T may be formed in such a manner that at least one portion thereof may bend and contact a portion of the photoelectric conversion device region ACT_P.

A gate TG of a charge transfer device TD may be formed near an interface between the photoelectric conversion device region ACT_P and the read device region ACT_T in each of the active areas ACT and ACT', and may receive the charge transfer signal Tx (see FIG. 5) from the row driver 30 (see FIG. 1) via a contact CON1. A gate RG of a reset device RD, a gate DG of a drive device DD, and a gate SG of a selection device SD may be formed apart from one another by a predetermined distance in the read device region ACT_T. An arrangement of various elements illustrated in FIG. 6 is just illustrative and varies in some cases. For example, the arrangement of various elements may vary when, as described above, each of the unit pixels 10a_1 and 10b_1 has a structure including three transistors, a structure including five transistors, or a photo gate structure similar to a structure including four transistors.

A source and drain of the reset device RD may be respectively connected to a floating diffusion region FD and a power supply voltage Vdd terminal. When the reset signal Rx (see FIG. 5) is supplied to the gate RG of the reset device RD from the row driver 30 (see FIG. 1) via a contact CON3, the reset device RD may be turned on to reset the floating diffusion region FD.

Electric charges in the floating diffusion region FD are supplied to the gate DG of the drive device DD via a wire (not shown) connecting a contact CON2 and a contact CON4 to control current flowing through the selection device SD that is turned on by the selection signal SEL (see FIG. 5) provided to the gate SG of the selection device SD from the row driver 30 via a contact CON5. A path of the wire connecting the contacts CON2 and CON4 may be short to prevent a reduction in conversion efficiency, caused when a capacitance of a conductive layer (not shown) forming the wire increases. To form the wire, the contact CON2 does not need to be connected to the contact CON4 formed in the active area ACT in which the contact CON2 is also formed, and may be connected to a contact CON4 formed in another active area ACT adjacent to the active area ACT in which the contact CON2 is formed for short routing of the wire, if needed. The current flowing through the selection device SD may be output as an output signal of each of the unit pixels 10a_1 and 10b_1 via an output terminal Vout of each of the unit pixels 10a_1 and 10b_1. The output signal may be read from a load transistor (not shown) connected to the output terminal Vout.

Referring to FIG. 6, a layout of the unit pixel 10b_1 is substantially the same as that of the unit pixel 10a_1, except that a potential drain region 140 may be formed on the semiconductor layer on which the unit pixel 10b_1 is disposed. In other words, the potential drain region 140 may be formed in a light-shielding region of the semiconductor layer on which the unit pixel 10b_1 is disposed. Also, a contact region 112 may be included in the photoelectric conversion device region ACT'_P of the active area ACT' of the unit pixel 10b. In the photoelectric conversion device region ACT_P of the unit pixel 10b_1, a power supply voltage Vdd terminal may be connected to the contact region 112. The potential drain region 140 and the contact region 112 will now be described in detail with reference to FIG. 7.

Figure 7:
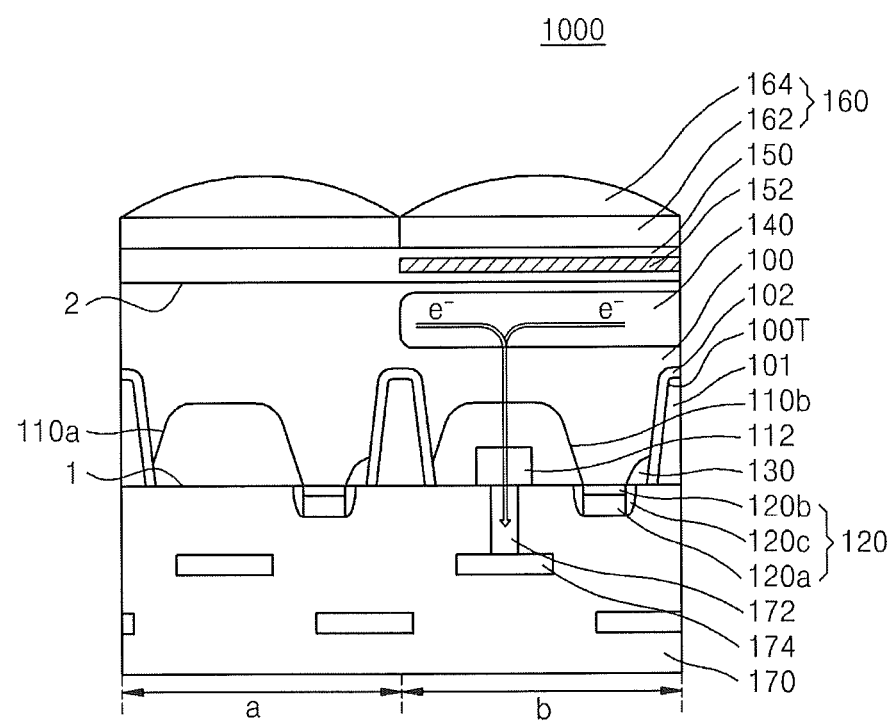
FIG. 7 is a side cross-sectional view of an image sensor as shown in FIG. 5 or 6, taken along a line VII-VII of FIG. 6.

FIG. 7 is a side cross-sectional view of an image sensor 1000 as shown in FIG. 5 or 6, taken along a line VII-VII of FIG. 6.

Referring to FIG. 7, the image sensor 1000 may include an interconnecting layer 170, a semiconductor layer 100, an insulating layer 150, and a light transmission layer 160.

The interconnecting layer 170 may be formed on an upper surface 1 of the semiconductor layer 100. The interconnecting layer 170 may include a plurality of metal wires that are vertically stacked, e.g., a power supply voltage wire 174. The interconnecting layer 170 may include a contact 172 that electrically connects a contact region 112 of a photoelectric conversion device 110b and the power supply voltage wire 174 in a light-shielding region b of the semiconductor layer 100. The photoelectric conversion device 110b that is connected to the contact 172 may be used as a path via which electric charges accumulated in a potential drain region 140, which will be described below, may be drained.

The interconnecting layer 170 may include charge transfer gates 120 of a charge transfer device TD from among read devices of each of the unit pixels. Each of the charge transfer gates 120 may include an insulating layer 120b and an electrode layer 120a that are sequentially stacked, and spacers 120c formed on sidewalk of the insulating layer 120b and the electrode layer 120a. Each of the charge transfer gates 120 may receive a charge transfer signal Tx via a contact (not shown) formed between the electrode layer 120a and a metal wire. In an embodiment of the inventive concept, the charge transfer gates 120 may have a structure in which the electrode layer 120a extends in a depthwise direction of the semiconductor layer 100. For example, the charge transfer gates 120 may be formed in recessed regions of the interconnection layer 170, although embodiments of the inventive concept are not limited thereto. The interconnecting layer 170 may further include other read devices. Specifically, the interconnecting layer 170 may further include read devices, e.g., the reset device RD, the drive device DD, and the selection device SD, which may be included in each pixel as described above with reference to FIGS. 5 and 6. The interconnecting layer 170 may further include contacts (not shown) for supplying a driving signal to the read devices. The interconnecting layer 170 may also include control devices as described above with reference to FIG. 1. That is, the interconnecting layer 170 may include the row decoder 20, the row driver 30, the column decoder 40, the timing generator 50, the CDS 60, the ADC 70, and the I/O buffer 80 illustrated in FIG. 1.

The semiconductor layer 100 is divided into a light-receiving region a and the light-shielding region b defined by a light-shielding pattern 152. In the light-receiving region a and the light-shielding region b, photoelectric conversion devices 110a and 110b and floating diffusion regions 130 of the unit pixels may be formed.

The semiconductor layer 100 may be a p-type epitaxial layer, or a bulk semiconductor substrate including p-type wells. The inventive concept will be described based on an assumption that the semiconductor layer 100 is a p-type epitaxial layer. However, the inventive concept is not limited thereto, and the semiconductor layer 100 may be any of other various semiconductor layers, e.g., an n-type epitaxial layer, a bulk silicon substrate, and an SOI substrate. A thickness of the semiconductor layer 100 may be determined according to a range of the wavelength of light incident on the light-receiving region a, since a penetration depth of the semiconductor layer 100 may vary according to a range of the wavelength of external light.

The unit pixels may be separated from one another by isolation regions 101 that define active areas of the semiconductor layer 100. The isolation regions 101 may be formed of an insulating material. The semiconductor layer 100 may include impurity regions 102 each covering sidewalls and a lower surface of one of the isolation regions 101. The impurity regions 102 may be p-type wells. Doping concentrations density of impurity regions 102 may be higher than that of the semiconductor layer 100. The impurity regions 102 may reduce cross-talk from occurring.

In the active areas, the photoelectric conversion devices 110a and 110b and the floating diffusion regions 130 may be formed adjacent to the upper surface 1 of the semiconductor layer 100. According to an embodiment of the inventive concept, photodiodes may be formed by combining the semiconductor layer 100 which is a p-type epitaxial layer and n-type impurity regions, which are obtained by doping the semiconductor layer 100 with n-type impurities, as the photoelectric conversion devices 110a and 110b. According to another embodiment of the inventive concept, pinned photodiodes having a pnp junction structure including the semiconductor layer 100 which is a p-type epitaxial layer, p-type impurity regions disposed adjacent to the upper surface 1 of the semiconductor layer 100, and an n-type impurity region disposed between the p-type semiconductor layer 100 and the p type impurity region may be formed, as the photoelectric conversion devices 110a and 110b. In this case, a doping concentration of the p-type impurity region may be higher than that of the p-type semiconductor layer 100. Also, a doping concentration of the n-type impurity region may be high. Thus, the n-type impurity region has a higher electric potential than the electrical potentials of the p-type semiconductor layer 100 and the p-type impurity region, and wells capable of accumulating electrons may be formed in the n-type impurity region. It will be hereinafter assumed that the photoelectric conversion devices 110a and 110b are pinned photodiodes.

The contact region 112 may be formed in the photoelectric conversion device 110b of the light-shielding region b. The contact region 112 may be doped with n-type impurities. A doping concentration of the n-type impurity region of the contact region 112 may be high, similar to the n-type impurity region of the photoelectric conversion device 110b. The contact region 112 may have a narrower width than that of the photoelectric conversion device 110b. The contact region 112 may be formed to overlap with the p-type impurity region and the n-type impurity region of the photoelectric conversion device 110b. The contact region 112 may be electrically connected to the power supply voltage wire 174 via the contact 172. Thus, the photoelectric conversion device 110b including the contact region 112 of the light-shielding region b may provide a path via which electrons accumulated in the potential drain region 140 which will be described below may be drained. The floating diffusion regions 130 may be disposed apart from one another by a distance corresponding to a width of the gate TG of the charge transfer device TD to be parallel with the photoelectric conversion devices 110a and 110b. The floating diffusion regions 130 may each have a lightly doped drain (LDD) structure or a doubled doped drain (DDD) structure. Although FIG. 7 illustrates that only one unit pixel is included in the light-shielding region b, a plurality of unit pixels may be included in the light-shielding region b, and at least one unit pixel may have the photoelectric conversion device 110b including the contact region 112, from among the plurality of unit pixels.

The potential drain region 140 may be formed adjacent to the lower surface 2 of the semiconductor layer 100 in the light-shielding region b of the semiconductor layer 100. The potential drain region 140 may be formed in the entire light-shielding region b. In other words, the potential drain region 140 may have substantially the same area as that of the light-shielding pattern 152 that defines the light-shielding region b. The potential drain region 140 may be spaced apart by a predetermined distance from an interface between the lower surface 2 of the semiconductor layer 100 and the insulating layer 150. Also, the potential drain region 140 may be disposed vertically apart from the n-type impurity region of the photoelectric conversion device 110b. The potential drain region 140 may include a plurality of sub potential drain regions (not shown) that are formed to a thin thickness and that are spaced apart from one another by a predetermined distance.

The potential drain region 140 may be doped with n-type impurities. According to an embodiment of the inventive concept, a doping concentration of the potential drain region 140 may be lower than that of the n-type impurity region of the photoelectric conversion device 110b. By doping the potential drain region 140 with n-type impurities, the potential drain region 140 may thus have a higher electric potential than that of the semiconductor layer 100 doped with p-type impurities. Thus, the potential drain region 140 may accumulate electrons generated due to defects occurring near an interface between the semiconductor layer 100 and the insulating layer 150. For example, the potential drain region 140 may accumulate electrons generated due to crystal defects, dangling bonds, plasma damage, or contamination occurring at the interface between the semiconductor layer 100 and the insulating layer 150. As described above, the electrons accumulated in the potential drain region 140 may be drained via the unit pixel of the light-shielding region b having a high electric potential corresponding to a power supply voltage Vdd.

The insulating layer 150 may be conformally formed on the lower surface 2 of the semiconductor layer 100. Also, since the light transmission layer 160 is formed on the insulating layer 150, the image sensor 1000 may be a back side illumination (BSI) complementary metal oxide semiconductor (CMOS) image sensor in which light is incident on the lower surface 2 of the semiconductor layer 100.

The insulating layer 150 may be a thermal oxide film obtained according to a thermal oxidation process, may be an oxide film formed by chemical vapor deposition (CVD), or may be a chemical oxide film obtained when the lower surface 2 of the semiconductor layer 100 reacts with a chemical solution. The insulating layer 150 may be used to remove some of defects occurring on the lower surface 2 of the semiconductor layer 100, and may act as an anti-reflection layer that minimizes or prevents light incident on the lower surface 2 of the semiconductor layer 100 from being reflected, thus minimizing or preventing any reduction in the amount of incident light.

The insulating layer 150 may include the light-shielding pattern 152 that defines the light-receiving region a and the light-shielding region b of the semiconductor layer 100. The light-shielding pattern 152 may be formed of, for example, at least one material selected from the group consisting of copper (Cu), aluminum (Al), tungsten (W), titanium (Ti), molybdenum (Mo), tantalum (Ta), a titanium nitride film (TiN), a tantalum nitride film (TaN), a zirconium nitride film (ZrN), and a tungsten nitride film (TiN). The light-shielding pattern 152 may be formed to a thickness that is sufficient to completely block incident light. The thickness of the light-shielding pattern 152 may vary according to materials used to form the light-shielding pattern 152, since the capabilities of absorbing and blocking light of the light-shielding pattern 152 depend on the materials used.

The light transmission layer 160 may be formed on the insulating layer 150. The light transmission layer 160 may include color filters 162 and microlenses 164. The color filters 162 may respectively correspond to the photoelectric conversion devices 110a and 110b formed on the semiconductor layer 100. According to an embodiment of the inventive concept, the color filters 162 may be disposed not only in the light-receiving region a but also in the light-shielding region b. In this case, color filters 162 disposed in the light-shielding region b may be used as dummy patterns. According to another embodiment of the inventive concept, red, green, or blue color filters 162 may be two-dimensionally disposed on the insulating layer 150 according to unit pixels. According to an embodiment of the inventive concept, the color filters 162 may be different color filters, e.g., cyan, magenta, or yellow color filters.

The microlenses 164 may be disposed on the color filters 162, respectively. The microlenses 164 may be disposed in not only the light-receiving region a but also the light-shielding region b, similar to the color filters 162. In this case, the microlenses 164 disposed in the light-shielding region b may be used as dummy patterns. The microlenses 164 may concentrate incident light in the photoelectric conversion devices 110a and 110b by changing a path of light incident on regions other than the photoelectric conversion devices 110a and 110b. Each of the microlenses 164 may have a convex shape and may have a predetermined radius of curvature. The microlenses 164 may be formed of transparent resin that transmits light therethrough.

As described above, in the case of general image sensors, even if the hydrogen alloy process is performed, the difference between dark levels of the light-receiving region and the light-shielding region may be large due to a light-shielding pattern. However, in the image sensor 1000 according to an embodiment of the inventive concept, electrons generated due to defects occurring in the light-shielding region b of the semiconductor layer 100 may be accumulated in the potential drain region 140 and may be drained via the photoelectric conversion device 110b of a unit pixel in the light-shielding region b, to which a power supply voltage Vdd is applied. Thus, even if the defects are not fixed during the hydrogen alloy process, the image sensor 1000 is capable of reducing the difference between the dark levels of the light-receiving region a and the light-shielding region b. Also, the image sensor 1000 is capable of reducing or preventing degradation in image quality, caused by such a dark level difference, thereby providing a high-quality image.

Figure 8:
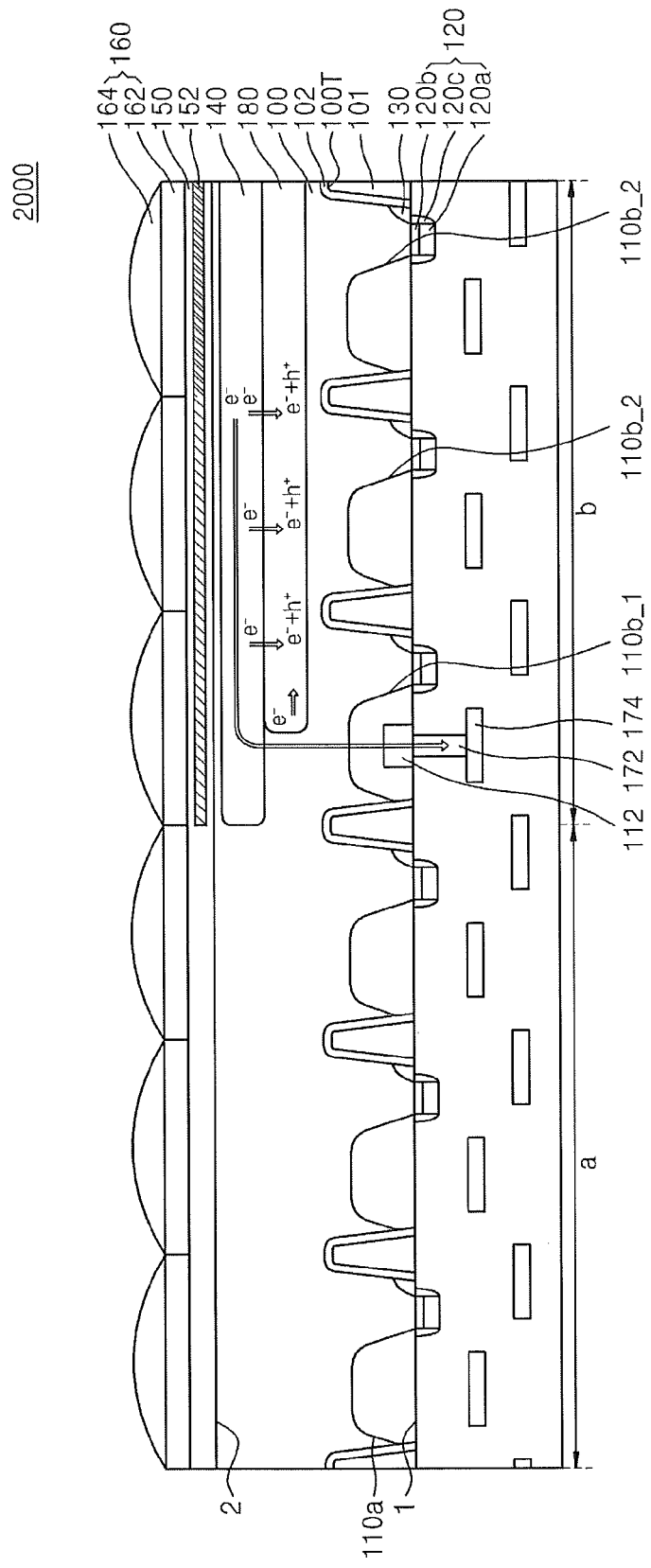
FIGS. 8 to 10 are side cross-sectional views of modified examples of an image sensor according to an embodiment of the inventive concept.
Figure 9:
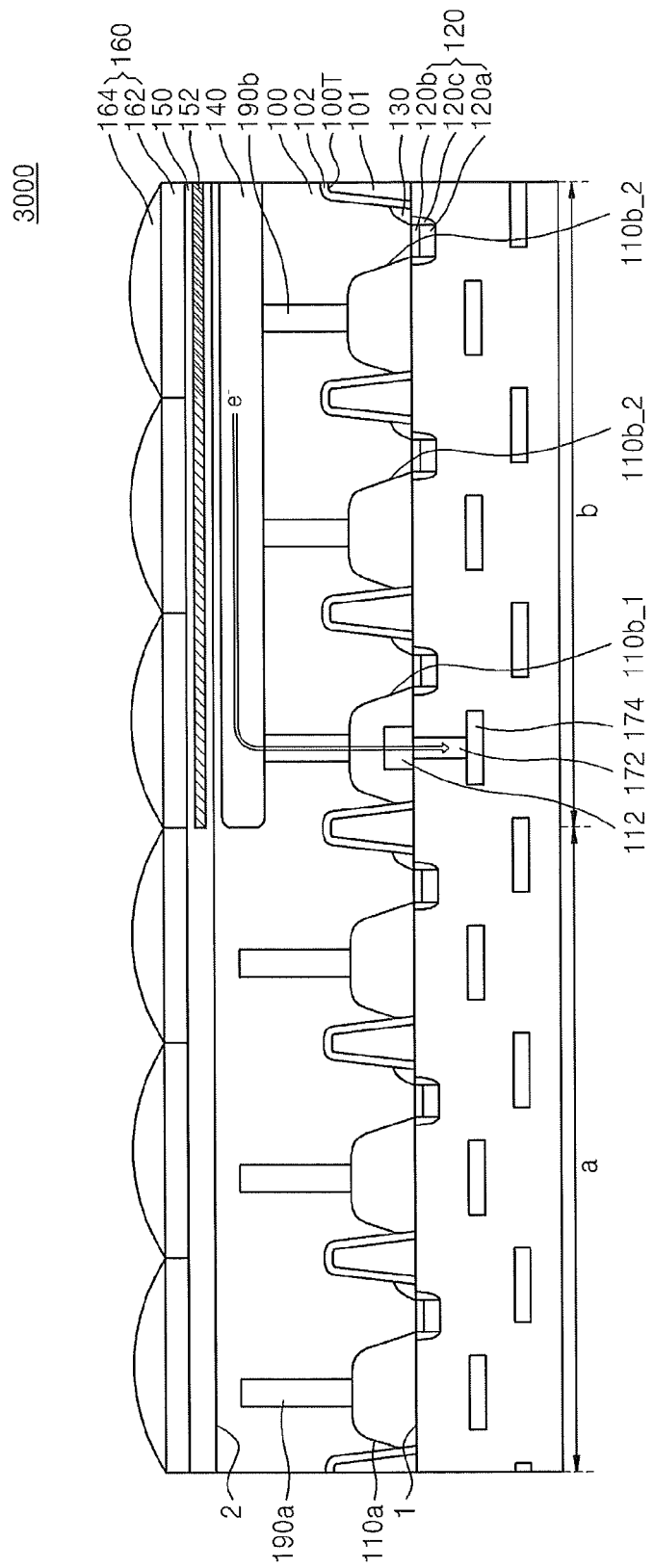
Figure 10:
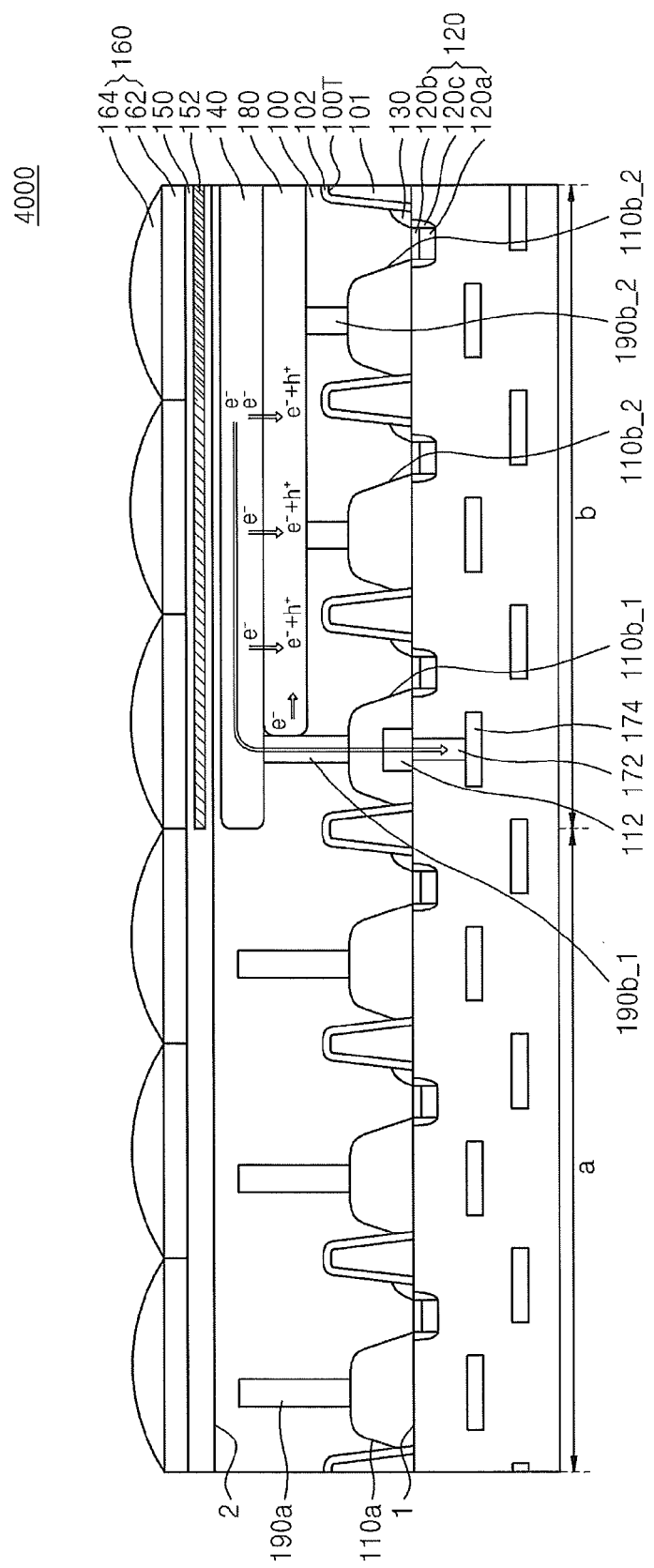

FIGS. 8 to 10 are side cross-sectional views of modified examples of an image sensor according to an embodiment of the inventive concept. In FIGS. 8 to 10, for convenience of explanation, unit pixels are further illustrated in the light-receiving region a and the light-shielding region b of the semiconductor layer 100 of FIG. 7. The embodiments of FIGS. 8 to 10 will be described in terms of the differences from the embodiment of FIG. 7. Elements that are the same as or similar to those of FIG. 7 are denoted by the same reference numeral and are not described again here.

Referring to FIGS. 7 and 8, an image sensor 2000 may further include a barrier region 180 formed adjacent to a potential drain region 140 of a light-shielding region b of a semiconductor layer 100.

The barrier region 180 may have substantially the same area as that of a light-shielding pattern 152 that defines the light-shielding region b. For example, the barrier region 180 may be formed in most of the light-shielding region b, except for a unit pixel that provides a path via which electrons accumulated in a potential drain region 140 may be drained. The barrier region 180 may contact the potential drain region 140 on a lower surface of the semiconductor layer 100 or may be spaced apart from the potential drain region 140 by a predetermined distance. The barrier region 180 may be formed to a predetermined thickness to be disposed vertically apart from an n-type impurity region of the photoelectric conversion device 110b. The barrier region 180 may include a plurality of sub barrier regions (not shown) that are formed to a thin thickness and that are spaced apart from one another by a predetermined distance.

The barrier region 180 may be doped with p-type impurities. In an embodiment of the inventive concept, a doping concentration of the barrier region 180 may be higher than that of the semiconductor layer 100 that is doped with p-type impurities. When some electrons generated due to defects occurring near an interface between the semiconductor layer 100 and an insulating layer 150 are not accumulated in the potential drain region 140 but are moved to photoelectric conversion devices 110b_1 and 110b_2 or when some of the electrons cannot be drained from the potential drain region 140 to the photoelectric conversion device 110b, the barrier region 180 doped with high-concentration p-type impurities may extinguish these electrons by recombining them with holes. Also, the barrier region 180 may extinguish electrons generated due to defects occurring between the photoelectric conversion devices 110b_1 and 110b_2 and the potential drain region 140 of the semiconductor layer 100 by recombining the electrons with holes. Thus, in the image sensor 2000, the difference between dark levels of the light-receiving region a and the light-shielding region b may be reduced.

Referring to FIGS. 7 and 9, an image sensor 3000 may further include a plurality of electron adjustment path regions 190a and 190b that each provide an electron moving path to photoelectric conversion devices 110a, 110b_1, and 110b_2 of unit pixels of a semiconductor layer 100.

In a light-receiving region a, the electron adjustment path regions 190a may extend apart from a lower surface 2 of the semiconductor layer 100 in a depthwise direction of the semiconductor layer 100 and be formed adjacent to the corresponding photoelectric conversion device 110a. In a light-shielding region b, the electron adjustment path regions 190b may extend perpendicular to the semiconductor layer 100 and be formed between a potential drain region 140 and the photoelectric conversion devices 110b_1 and 110b_2.

Widths of the electron adjustment path regions 190a and 190b may be less than or equal to those of the photoelectric conversion devices 110a, 110b_1, and 110b_2. The electron adjustment path regions 190a and 190b may have different widths. Although FIG. 9 illustrates that the electron adjustment path regions 190a and 190b have substantially uniform straight-line cylindrical shapes, the inventive concept is not limited thereto and the electron adjustment path regions 190a and 190b may have different shapes. Also, although FIG. 9 illustrates that each of the electron adjustment path regions 190a and 190b are formed to correspond to one of the photoelectric conversion devices 110a, 110b_1, and 110b_2, the inventive concept is not limited thereto and at least two electron adjustment path regions from among the electron adjustment path regions 190a and 190b may be formed to correspond to one of the photoelectric conversion devices 110a, 110b_1, and 110b_2.

The electron adjustment path regions 190a and 190b may be doped with n-type impurities. According to an embodiment of the inventive concept, doping concentrations of the electron adjustment path regions 190a and 190b may be lower than those of n-type impurity regions of the photoelectric conversion devices 110a, 110b1, and 110b_2. Thus, the electron adjustment path regions 190a and 190b may decrease a variation in an electric potential between the n-type impurity regions of the photoelectric conversion devices 110a, 110b_1, and 110b_2 and a p-type impurity region of the semiconductor layer 100. Thus, the electron adjustment path regions 190a and 190b may not only provide a path for moving electrons to the corresponding photoelectric conversion devices 110a, 110b_1, and 110b_2 but also reduce or prevent electrons from being moved adjacent to the photoelectric conversion devices. Thus, the electron adjustment path regions 190a of the light-receiving region a may secure a path for moving electrons generated from incident light and may prevent cross-talk from occurring between adjacent pixels. The electron adjustment path regions 190b of the light-shielding region b may provide a path for draining electrons accumulated in the potential drain region 140. Thus, the image sensor 3000 is capable of not only reducing the difference between dark levels of the light-receiving region a and the light-shielding region b but also providing high sensitivity and color quality.

Referring to FIG. 10, an image sensor 4000 may include a barrier region 180 and electron adjustment path regions 190a, 190b_1, and 190b_2. As described above with reference to FIG. 8, the barrier region 180 may be formed in most of a light-shielding region b, except for a unit pixel that provides a path via which electrons accumulated in a potential drain region 140 are drained. Also, as described above with reference to FIG. 9, in the light-receiving region a, the electron adjustment path regions 190a may be formed to contact corresponding photoelectric conversion devices 110a, 110b_1, and 110b_2. In the light-shielding region b, the electron adjustment path region 190b_1 may be formed between the potential drain region 140 and the photoelectric conversion device 110b_1, and the electron adjustment path region 190b_2 may be formed between the barrier region 180 and the photoelectric conversion device 110b_2. As described above with reference to FIGS. 8 and 9, the image sensor 4000 includes the barrier region 180 and the electron adjustment path regions 190a, 190b_1, and 190b_2 and is thus capable of reducing the difference between dark levels of the light-receiving region a and the light-shielding region b and providing high sensitivity and color quality.

Figure 11:
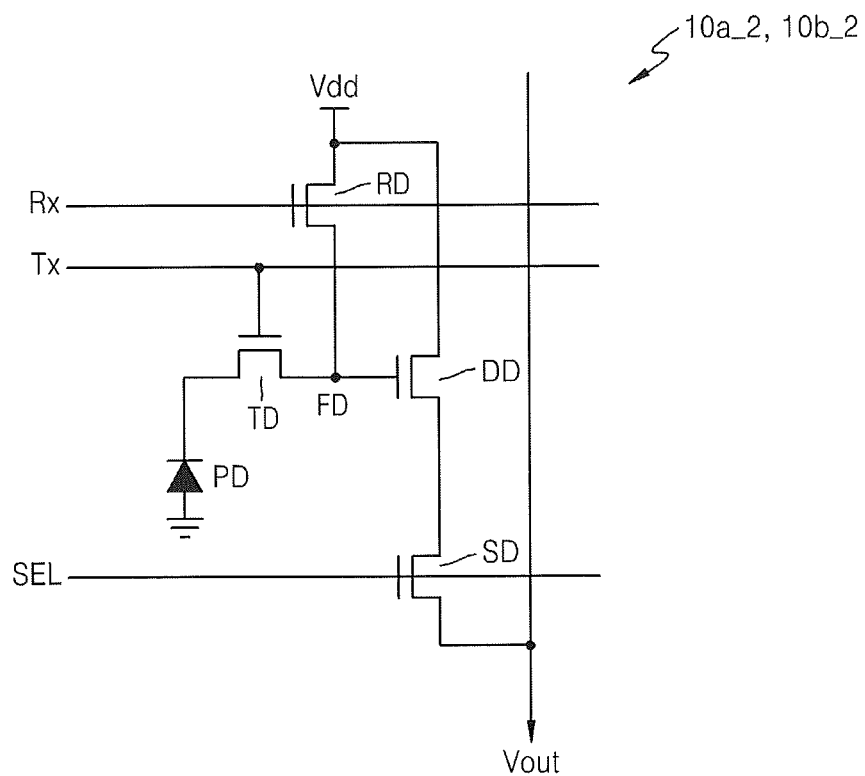
FIG. 11 is an equivalent circuit diagram of unit pixels included in an image sensor, according to another embodiment of the inventive concept.
Figure 12:
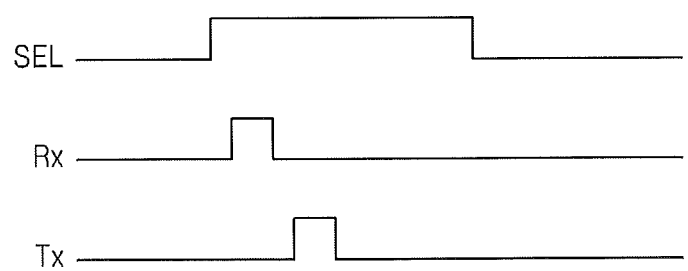
FIGS. 12 and 13 are timing diagrams of driving signals for driving the unit pixels of FIG. 11, according to embodiments of the inventive concept.
Figure 13:
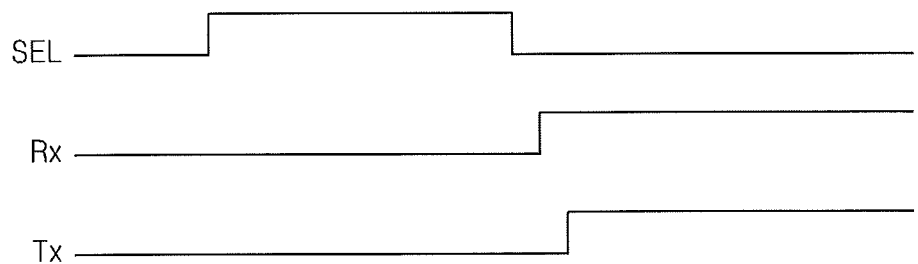

FIG. 11 is an equivalent circuit diagram of unit pixels included in an image sensor, according to another embodiment of the inventive concept. FIGS. 12 and 13 are timing diagrams of driving signals for driving the unit pixels of FIG. 11, according to embodiments of the inventive concept. The embodiments of FIGS. 11 to 13 will be described in terms of the difference from the embodiment of FIG. 5. Elements that are the same as or similar to those of FIG. 5 are denoted by the same reference numeral and are not described again here.

Referring to FIG. 11, unlike the unit pixels 10a_1 and 10b_1 illustrated in FIG. 5, a unit pixel 10a_2 of a light-receiving region a may have substantially the same structure as that of a unit pixel 10b_2 of a light-shielding region b. In the unit pixel 10b_1 of the light-shielding region b of FIG. 5, a power supply voltage Vdd is applied to the photoelectric conversion device PD to drain electrons accumulated in a potential drain region (not shown) to the photoelectric conversion device PD, whereas in the unit pixel 10b_2 of the light-shielding region b of FIG. 11, a path for draining electrons accumulated in a potential drain region (not shown) may be provided by controlling a charge transfer device TD and a reset device SD, as will be described with reference to FIG. 12.

FIG. 12 is a timing diagram of driving signals for driving the unit pixel 10a_2 of the light-receiving region a, according to an embodiment of the inventive concept. Referring to FIG. 12, in the unit pixel 10a_2, when a row selection signal SEL is activated to a logic high level for a predetermined time period when a read operation is performed, a reset signal Rx is activated to reset a floating diffusion region FD and an electrical signal corresponding to the reset floating diffusion region FD is then output. Then, electric charges generated by a photoelectric conversion device PD while a charge transfer signal Tx is activated to the logic high state are delivered to the reset floating diffusion region FD, and the unit pixel 10a_2 outputs an electrical signal corresponding to a change in the amount of the electric charges in the floating diffusion region FD. In other words, the unit pixel 10a_2 of the light-receiving region a may be driven in a manner that unit pixels of a general image sensor are driven, and then output an electrical signal corresponding to light incident thereon via an output line Vout thereof.

FIG. 13 is a timing diagram of driving signals for driving the unit pixel 10b_2 of the light-receiving region b, according to another embodiment of the inventive concept. Referring to FIG. 13, in the unit pixel 10b_2, when a row selection signal SEL is not activated to a logic high state for a predetermined time period when a read operation is performed, a charge transfer signal Tx and a reset signal Rx are activated to the logic high state. In other words, in the unit pixel 10b_2, when a selection device SD is not turned on, a charge transfer device TD and a reset device RD are turned on to secure a path for draining electrons to a drain of the reset device RD to which a power supply voltage Vdd is applied, via the floating diffusion region FD. Thus, the unit pixel 10b_2 may provide a path for draining electrons accumulated in a potential drain region (not shown). The controlling of the unit pixel 10b_2 described above may be performed using the timing generator 50 and the row driver 30 described above with reference to FIG. 1. At least one of the unit pixels of the light-shielding region b may be controlled as described above.

Figure 14:
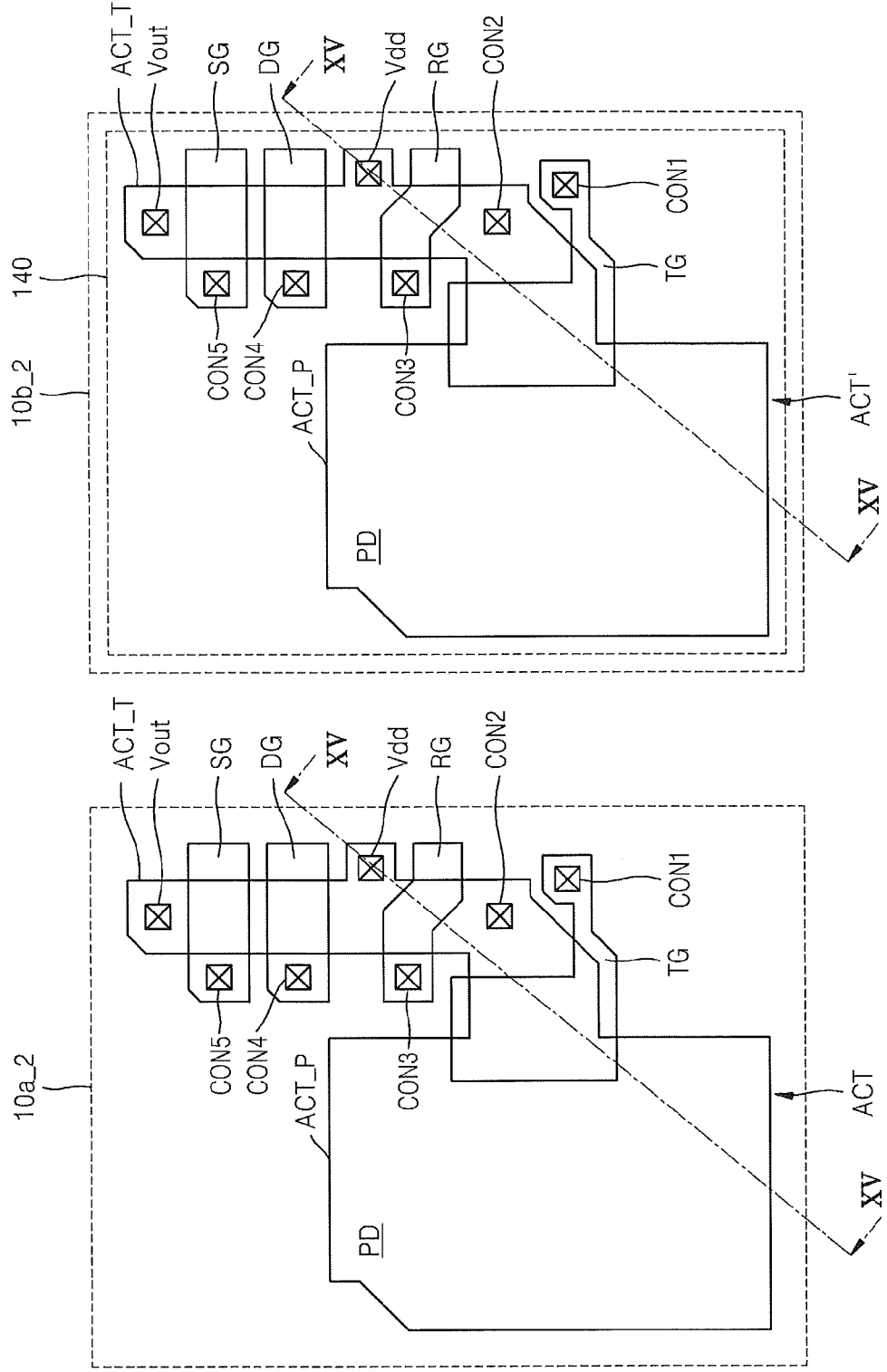
FIG. 14 is a schematic layout diagram of unit pixels included in an image sensor, according to another embodiment of the inventive concept.

FIG. 14 is a schematic layout diagram of unit pixels included in an image sensor, according to another embodiment of the inventive concept. FIG. 14 illustrates two adjacent unit pixels 10a_2 and 10b_2 that are formed at an interface between a light-receiving region a and a light-shielding region b of a semiconductor layer. The two adjacent unit pixels 10a_2 and 10b_2 correspond to the unit pixels 10a_2 and 10b_2 of FIG. 11, respectively. The embodiment of FIG. 14 will be described in terms of its differences from the embodiment of FIG. 6. Elements that are the same as or similar to those of FIG. 6 are denoted by the same reference numeral and are not described again here.

Referring to FIG. 14, the unit pixels 10a_2 and 10b_2 may have substantially the same layout. A potential drain region 140 may be formed on the semiconductor layer on which the unit pixel 10b_2 is disposed. Although not shown, a barrier region and/or electron adjustment path regions as described above may further be formed on the semiconductor layer on which the unit pixel 10b_2 is disposed. Similarly, electron adjustment path regions as described above may further be formed on the semiconductor layer on which the unit pixel 10a_2 is disposed.

Figure 15:
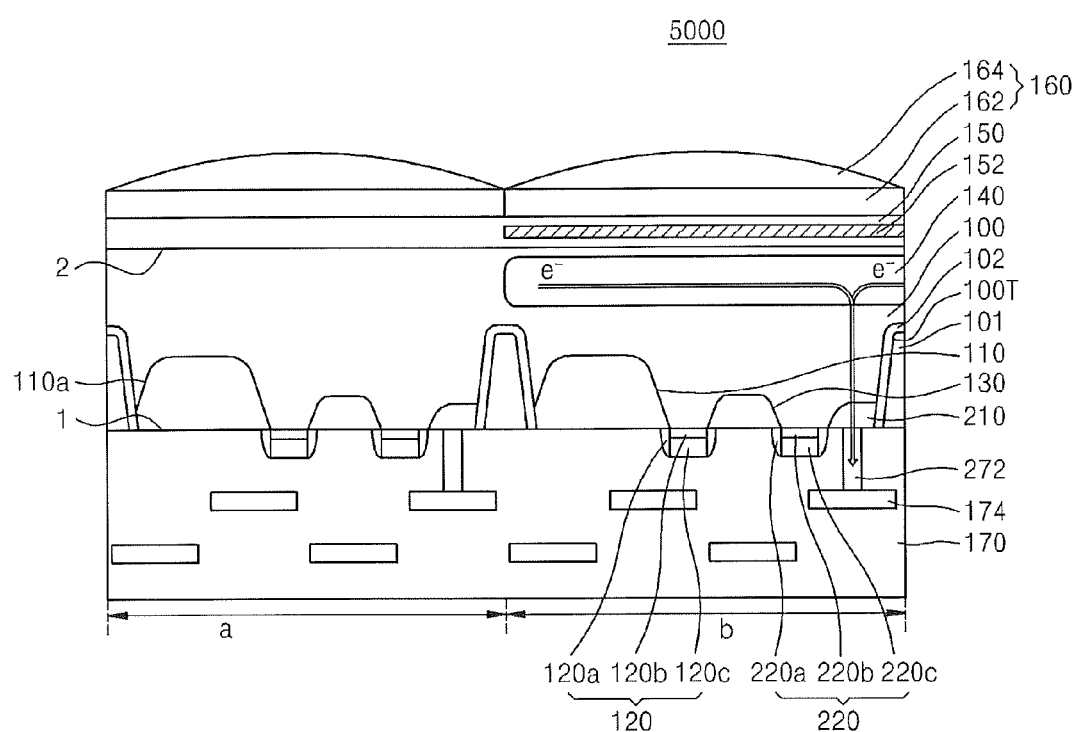
FIG. 15 is a side cross-sectional view of an image sensor as shown in FIGS. 11 and 14, taken along a line XV-XV of FIG. 14.

FIG. 15 is a side cross-sectional view of an image sensor 5000 as shown in FIGS. 11 and 14, taken along a line XV-XV of FIG. 14. The embodiment of FIG. 15 will be described in terms of its differences from the embodiment of FIG. 7. Elements that are the same as or similar to those of FIG. 7 are denoted by the same reference numeral and are not described again here.

In the image sensor 5000, an interconnecting layer 170 may include gates 220 of a reset device RD. Each of the gates 220 of the reset device RD may have substantially the same structure as that of the gate 120 of the charge transfer device TD described above. The interconnecting layer 170 may include a contact 272 for electrically connecting a drain 210 of the reset device RD and a power supply voltage wire 174. The drain 210 of the reset device RD that is connected to the contact 272 may be used as a path for draining electrons accumulated in a potential drain region 140 which will be described below. Although FIG. 15 illustrates only one unit pixel in a light-shielding region b, a plurality of unit pixels may be included in the light-shielding region b and at least one of the plurality of unit pixels may provide a path for draining electrons.

In the image sensor 5000, a semiconductor layer 100 may include the drain 210 of the reset device RD. The drain 210 of the reset device RD may have an LDD structure or a DDD structure similar to the floating diffusion region FD described above. Also, although not shown, the semiconductor layer 100 may further include a barrier region formed to correspond to the light-shielding region b and/or electron adjustment path regions formed in a light-receiving region a and the light-shielding region b to correspond to photoelectric conversion devices of the unit pixels.

According to an embodiment of the inventive concept, in the image sensor 5000, electrons generated due to interface defects and accumulated in the potential drain region 140 may not be drained to a photoelectric conversion device 110, and may instead be drained to the drain 210 of the reset device RD to which a power supply voltage Vdd is applied by turning on the charge transfer device TD and the reset device RD by using driving signals. Thus, unlike general image sensors as described above, the image sensor 5000 is capable of reducing the difference between dark levels of the light-receiving region a and the light-shielding region b even if such interface defects are not fixed during the hydrogen alloy process. Also, the image sensor 5000 is capable of reducing or preventing image defects, e.g., noise, caused due to such a dark level difference, thereby providing a high-quality image.

Figure 16:
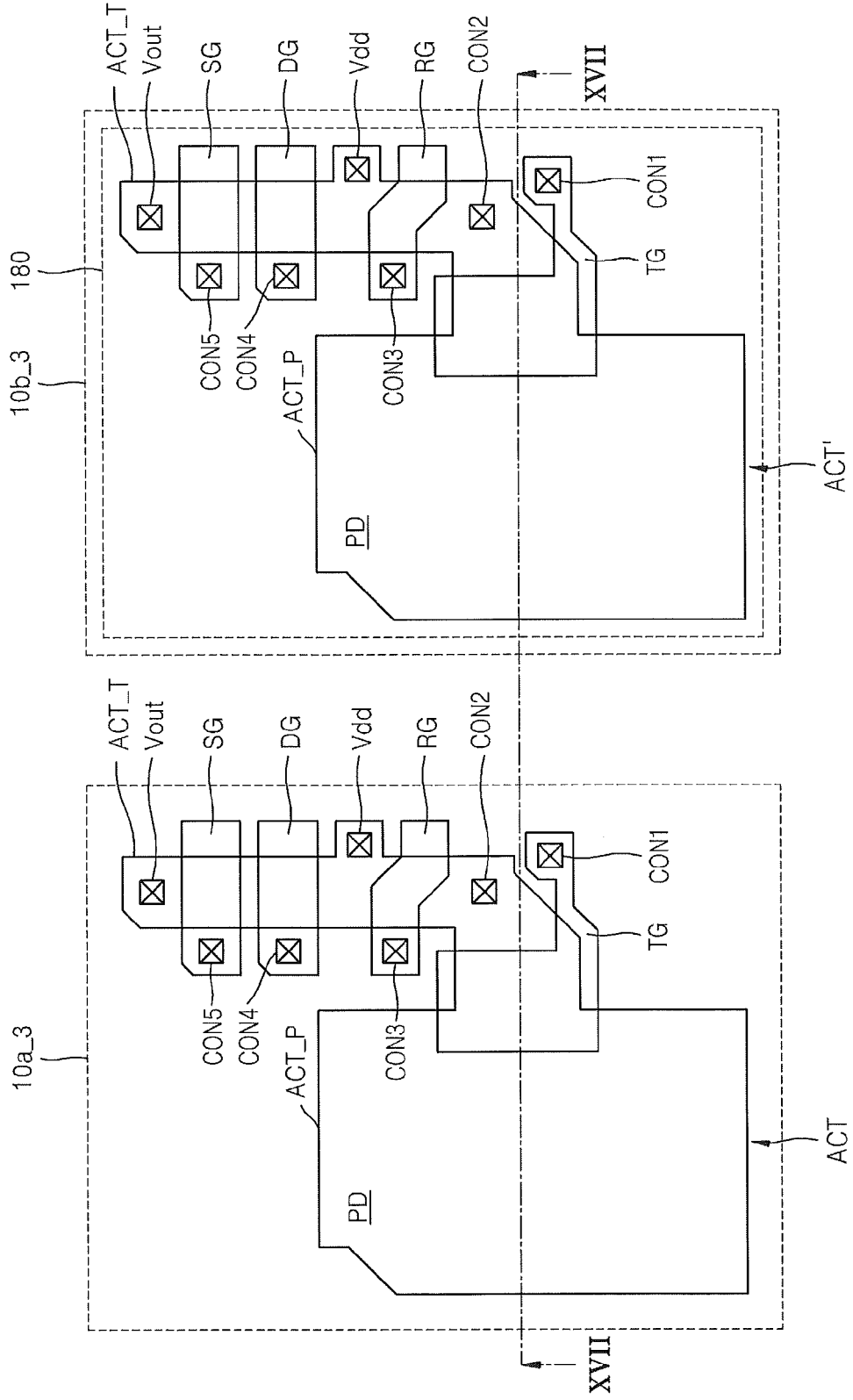
FIG. 16 is a schematic layout diagram of unit pixels included in an image sensor, according to another embodiment of the inventive concept.

FIG. 16 is a schematic layout diagram of unit pixels included in an image sensor, according to another embodiment of the inventive concept. FIG. 16 illustrates two adjacent unit pixels 10a_3 and 10b_3 formed at an interface between a light-receiving region a and a light-shielding region b of a semiconductor layer. The embodiment of FIG. 16 will be described in terms of its differences from the embodiments of FIGS. 6 and 14. Elements that are the same as or similar to those of FIGS. 6 and 14 are denoted by the same reference numeral and are not described again here.

Referring to FIG. 16, the unit pixels 10a_3 and 10b_3 may have substantially the same layout. The layouts of the unit pixels 10a_3 and 10b_3 may be substantially the same as, for example, those of the unit pixels 10a_2 and 10b_2 illustrated in FIG. 6, except that a barrier region 180 may be formed on a portion of the semiconductor layer on which the unit pixel 10b_3 is disposed.

Figure 17:
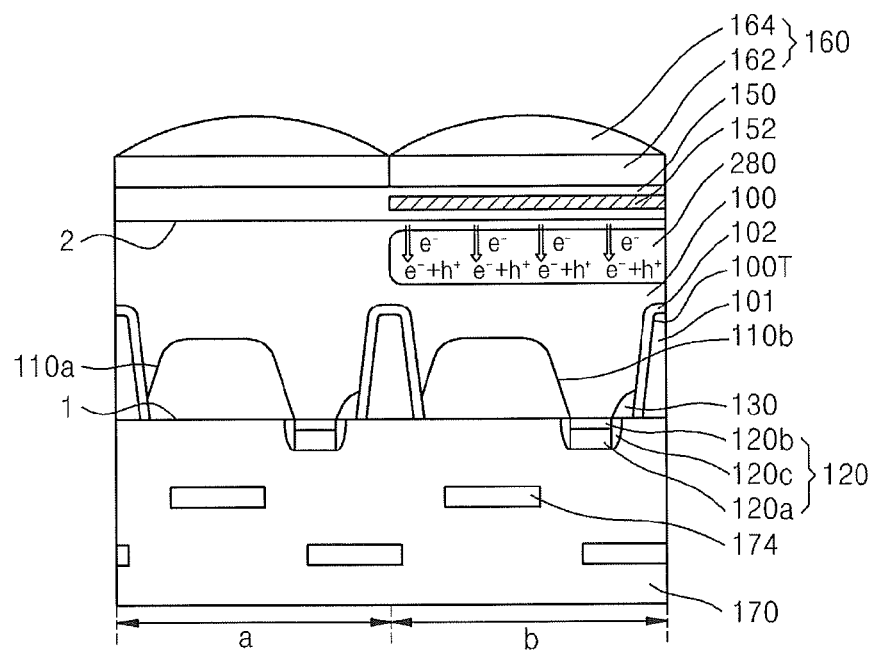
FIG. 17 is a side cross-sectional view of an image sensor as shown in FIG. 16, taken along a line XVI-XVI of FIG. 16.

FIG. 17 is a side cross-sectional view of an image sensor 6000 as shown in FIG. 16, taken along a line XVI-XVI of FIG. 16. The embodiment of FIG. 17 will be described in terms of its difference from the embodiments of FIGS. 7 and 15. Elements that are the same as or similar to those of FIGS. 7 and 15 are denoted by the same reference numeral and are not described again here.

Referring to FIG. 17, the image sensor 6000 may include unit pixels having the same structure in a light-receiving region a and a light-shielding region b of a semiconductor layer 100. In the light-shielding region b, the semiconductor layer 100 may include a barrier region 280 formed adjacent to an interface between a lower surface 2 of the semiconductor layer 100 and an insulating layer 150.

The barrier region 280 may be formed in the entire light-shielding region b. The barrier region 280 may be spaced apart from the interface between the lower surface 2 of the semiconductor layer 100 and the insulating layer 150 by a predetermined distance. Also, the barrier region 280 may be formed to a predetermined thickness to be vertically spaced apart from an n-type impurity region of a photoelectric conversion device 110b. Although FIG. 17 illustrates that only one barrier region 280 is included in the semiconductor layer 100, the barrier region 280 may include a plurality of sub barrier regions formed to a thin thickness and disposed apart from one another by a predetermined distance.

Similar to the barrier region 180 of FIG. 8, the barrier region 280 may be doped with high-concentration p-type impurities. Thus, the barrier region 280 may extinguish electrons generated due to defects occurring near the interface between semiconductor layer 100 and the insulating layer 150 by recombining the electrons with holes. As described above, when the barrier region 280 includes the plurality of sub barrier regions, the plurality of sub barrier regions may have the same or different doping concentrations. The image sensor 6000 may further include electron adjustment path regions (not shown) in the light-receiving region a and the light-shielding region b of the semiconductor layer 100.

As described above, the image sensor 6000 is capable of preventing movement, i.e., diffusion, of electrons generated due to defects occurring near the interface between semiconductor layer 100 and the insulating layer 150 in the light-shielding region b, and extinguishing the electrons, thereby reducing the difference between dark levels of the light-receiving region a and the light-shielding region b.

Figure 18:
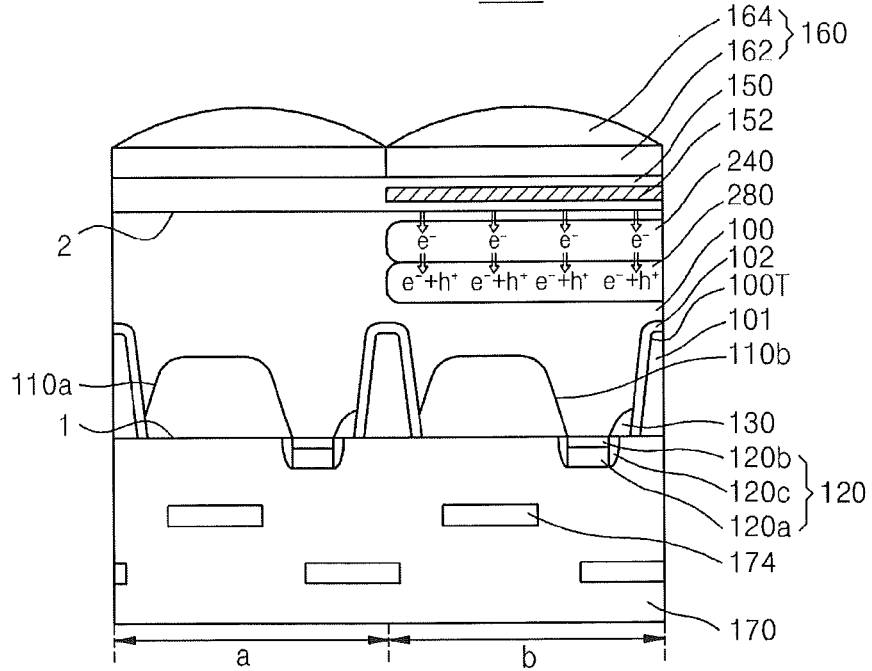
FIG. 18 is a side cross-sectional view of an image sensor according to a modified example of the inventive concept.

FIG. 18 is a side cross-sectional view of an image sensor 7000 according to a modified example of the inventive concept. The embodiment of FIG. 18 will be described in terms of its differences from the embodiment of FIG. 17. Elements that are the same as or similar to those of FIG. 17 are denoted by the same reference numeral and are not described again here.

Referring to FIGS. 17 and 18, the image sensor 7000 may further include a potential drain region 240 in a light-shielding region b of a semiconductor layer 100. Unlike the image sensor 6000 of FIG. 17, in the image sensor 7000, the potential drain region 240 may be formed adjacent to an interface between a lower surface 2 of the semiconductor layer 100 and an insulating layer 150, and a barrier region 280 may be formed adjacent to the potential drain region 240. The potential drain region 240 may be formed in the entire light-shielding region b. Although FIG. 18 illustrates that only one potential drain region 240 is included in the semiconductor layer 100, the potential drain region 240 may include a plurality of sub potential drain regions that are formed to a thin thickness and that are spaced apart from one another by a predetermined distance.

The potential drain region 240 may accumulate electrons generated due to defects occurring near the interface between the semiconductor layer 100 and the insulating layer 150 as described above (see FIG. 7 et al). The electrons accumulated in the potential drain region 240 are not drained via a unit pixel but are instead accumulated in the potential drain region 240, thereby reducing or preventing the electrons from being diffused to a photoelectric conversion device 110b. Even if the electrons are not accumulated in the potential drain region 240 and are diffused, they may be recombined with holes in the barrier region 280 and may thus be extinguished. Thus, the image sensor 7000 is capable of reducing the difference between dark levels of the light-receiving region a and the light-shielding region b.

Figure 19:
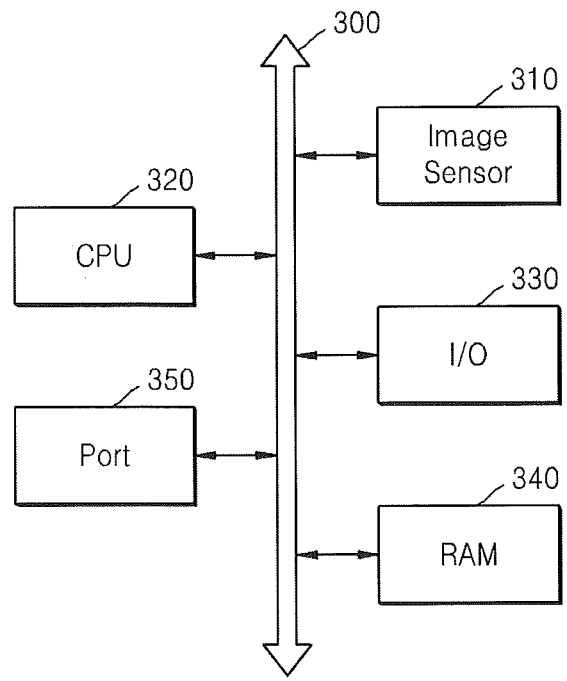
FIG. 19 is a schematic block diagram of a processor-based system including an image sensor according to an embodiment of the inventive concept.

FIG. 19 is a schematic block diagram of a processor-based system 8000 that includes an image sensor 310 according to an embodiment of the inventive concept. Referring to FIG. 19, the processor-based system 8000 is a system for processing an image output from the image sensor 310.

The processor-based system 8000 may be embodied as a computer system, a camera system, a scanner, a machined clock system, a navigation system, a video phone, a monitoring system, an automatic focusing system, a tracking system, a motion sensor system, an image stabilizing system, or the like, but is not limited thereto.

If the processor-based system 8000 is a computer system, then the processor-based system 8000 may include a central processing unit (CPU) 320, e.g., a microprocessor, which may communicate with an I/O device 330 via a bus 300. The image sensor 310 may communicate with the processor-based system 8000 via the bus 300 or any other communication link. The processor-based system 8000 may further include a random access memory (RAM) 340 and/or a port 350 which may communicate with the CPU 320 via the bus 300.

The port 350 may be used to couple a video card, a sound card, a memory card, a universal serial bus (USB) card, or the like to the processor-based system 8000, or may be a port via which the processor-based system 8000 may communicate with another system. The image sensor 310 may be integrated together with the CPU 320, a digital signal processor (DSP), or a microprocessor in one unit. The image sensor 310 may also be integrated together with a memory in one unit. In some cases, the image sensor 310 may integrated on a chip on which a processor is not installed.

The processor-based system 8000 may include an image sensor according to an embodiment of the inventive concept which is capable of reducing the difference between dark levels of a light-receiving region and a light-shielding region, and may thus process a high-quality output image having fewer image defects.

Figure 20:
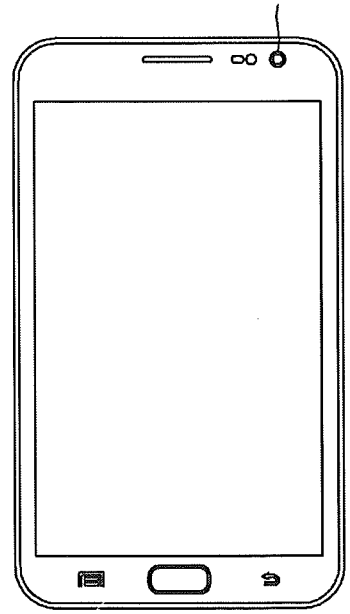
FIG. 20 is a perspective view of an electronic device that includes an image sensor, according to an embodiment of the inventive concept.

FIG. 20 is a front view of an electron device 9000 including an image sensor 400 according to an embodiment of the inventive concept. Referring to FIG. 20, the image sensor 400 may be included in the electron device 9000, e.g., a mobile phone. Also, the image sensor 400 may be installed in various devices, e.g., a camera, a camcorder, a personal digital assistant (PDA), a wireless phone, a laptop computer, an optical mouse, a facsimile, a copy machine, and the like.

An image sensor according to an embodiment of the inventive concept may also be installed into a telescope, a mobile phone handset, a scanner, an endoscope, a fingerprint recognition device, a toy, a game console, a household robot, an automobile, or the like. When an image sensor is employed in such electronic devices, the electronic devices are capable of obtaining a high-quality image having less image defects.

While the inventive concept has been particularly shown and described with reference to exemplary embodiments thereof, it will be understood that various changes in form and details may be made therein without departing from the spirit and scope of the following claims.

What is claimed is:

1. An image sensor comprising:
   a semiconductor layer including a plurality of unit pixels each including a photoelectric conversion device and read devices; and
   an insulating layer including a light-shielding pattern defining a light-receiving region and a light-shielding region of the semiconductor layer, the insulating layer on a first surface of the semiconductor layer,
   a potential drain region in the semiconductor layer between the photoelectric conversion device of a first of the unit pixels and the insulating layer in the light-shielding region, and
   at least a first of the unit pixels in the light-shielding region provides a drain path for draining electrons that accumulate in the potential drain region.

2. The image sensor of claim 1, wherein the potential drain region is formed in the entire light-shielding region.

3. The image sensor of claim 1, wherein the potential drain region is spaced apart from the photoelectric conversion device of each of the plurality of unit pixels.

4. The image sensor of claim 1, wherein the image sensor is a backside illumination type image sensor.

5. The image sensor of claim 1, wherein the drain path extends from the potential drain region through a portion of the semiconductor layer to the photoelectric conversion device of the first of the unit pixels.

6. The image sensor of claim 5, wherein the first of the unit pixels in the light-shielding region comprises a contact region in the photoelectric conversion device, to which a power supply voltage is applied, and
   the drain path extends from the potential drain region to the contact region.

7. The image sensor of claim 1, wherein the read devices comprise a reset device, and
   the drain path extends from the potential drain region to a reset device of the first of the unit pixels.

8. The image sensor of claim 7, wherein the read devices comprise a charge transfer device and a selection device,
   wherein the image sensor is configured so that the charge transfer device and the reset device are turned on when the selection device is not turned on.

9. The image sensor of claim 1, further comprising a barrier region formed in the semiconductor layer adjacent to the potential drain region in the light-shielding region, wherein the barrier region is configured to extinguish electrons in the potential drain region.

10. The image sensor of claim 9, wherein the barrier region is formed in a portion of the light-shielding region including unit pixels, except for the at least the first of the unit pixels providing the drain path.

11. The image sensor of claim 1, wherein the semiconductor layer is doped with impurities having a first conductivity type and the potential drain region is doped with impurities having a second conductivity type that is opposite the first conductivity type, the image sensor further comprising a plurality of electron adjustment path regions in the semiconductor layer that are doped with impurities having the second conductivity type, wherein each electron adjustment path region is configured to provide a respective path for moving electrons to the photoelectric conversion device of a respective one of the plurality of unit pixels.

12. The image sensor of claim 11, wherein the electron adjustment path regions in the light-receiving region extend in a depthwise direction of the semiconductor layer and are spaced apart from a lower surface of the semiconductor layer and adjacent to the photoelectric conversion devices of units pixels in the light-receiving region, respectively.

13. The image sensor of claim 11, wherein the electron adjustment path regions in the light-shielding region extend in a depthwise direction of the semiconductor layer, between the potential drain region and the photoelectric conversion devices of units pixels in the light-shielding region.

14. The image sensor of claim 1, wherein the semiconductor layer is doped with impurities having a first conductivity type and the potential drain region is doped with impurities having a second conductivity type that is opposite the first conductivity type.

15. The image sensor of claim 14, further comprising a barrier region formed in the semiconductor layer adjacent to the potential drain region in the light-shielding region, the barrier region doped with impurities having the first conductivity type at a higher concentration than other portions of the semiconductor layer.

16. The image sensor of claim 1, wherein the potential drain region has a higher electric potential than the semiconductor layer.

17. An image sensor comprising:
   a semiconductor layer including a plurality of unit pixels, each unit pixel including a photoelectric conversion device and read devices; and
   an insulating layer including a light-shielding pattern defining a light-receiving region and a light-shielding region of the semiconductor layer, the insulating layer on a lower surface of the semiconductor layer,
   a barrier region formed in the semiconductor layer adjacent to an interface between the semiconductor layer and the insulating layer in the light-shielding region, the barrier region having a higher doping concentration than a portion of the semiconductor layer that is between the barrier region and the insulating layer.

18. The image sensor of claim 17, wherein the barrier region is formed in the entire light-shielding region.

19. An image sensor, comprising:
   an insulating layer;
   a light-shielding pattern; and
   a semiconductor layer on the insulating layer and the light-shielding pattern, the semiconductor layer having a light-receiving region that includes a first photoelectric conversion device and a light-shielding region that includes a second photoelectric conversion device,
   wherein the light-shielding region of the semiconductor layer further includes at least an electron removal region, the first electron removal region being located between the second photoelectric conversion device and the insulating layer.

20. The image sensor of claim 19, wherein the electron removal region comprises a potential drain region in the light-shielding region of the semiconductor layer adjacent an interface between the semiconductor layer and the insulating layer and a drain path that extends from the potential drain region to at least the second photoelectric conversion device.

21. The image sensor of claim 19, wherein the electron removal region comprises a potential drain region in the light-shielding region of the semiconductor layer adjacent an interface between the semiconductor layer and the insulating layer and an electron adjustment path region in the semiconductor layer that provides a path for moving electrons from the potential drain region to the second photoelectric conversion device.

22. The image sensor of claim 19, wherein the electron removal region comprises a barrier region in the light-shielding region of the semiconductor layer that has a higher impurity doping concentration than a portion of the semiconductor layer that is between the barrier region and the second photoelectric conversion device.

23. The image sensor of claim 19, wherein the electron removal region does not extend into the light-receiving region of the semiconductor layer.

* * * * *